(12) United States Patent
Lin

(10) Patent No.: US 7,229,853 B2
(45) Date of Patent: Jun. 12, 2007

(54) METHOD OF MAKING A SEMICONDUCTOR CHIP ASSEMBLY USING MULTIPLE ETCH STEPS TO FORM A PILLAR AFTER FORMING A ROUTING LINE

(75) Inventor: Charles W. C. Lin, Singapore (SG)

(73) Assignee: Bridge Semiconductor Corporation, Taipei (TW)

( * ) Notice: Subject to any disclaimer, the term of this patent is extended or adjusted under 35 U.S.C. 154(b) by 0 days.

(21) Appl. No.: 11/374,343

(22) Filed: Mar. 13, 2006

(65) Prior Publication Data

US 2006/0166406 A1    Jul. 27, 2006

Related U.S. Application Data

(63) Continuation of application No. 10/889,368, filed on Jul. 12, 2004, now Pat. No. 7,064,012, which is a continuation-in-part of application No. 10/866,393, filed on Jun. 11, 2004, now Pat. No. 7,157,791.

(51) Int. Cl.
*H01L 21/48* (2006.01)

(52) U.S. Cl. .............................. 438/118; 257/E21.175; 257/E21.508

(58) Field of Classification Search ................ 438/597, 438/599, 611, 612, 613, 614; 257/E21.499, 257/E21.175, E21.508
See application file for complete search history.

(56) References Cited

U.S. PATENT DOCUMENTS

| | | | |
|---|---|---|---|
| 5,722,162 A | 3/1998 | Chou et al. | 29/852 |
| 6,001,671 A | 12/1999 | Fjelstad | 438/112 |
| 6,025,650 A | 2/2000 | Tsuji et al. | 257/786 |
| 6,159,770 A | 12/2000 | Tetaka et al. | 438/112 |
| 6,218,728 B1 | 4/2001 | Kimura | 257/693 |
| 6,440,835 B1 | 8/2002 | Lin | 438/611 |
| 6,444,489 B1 | 9/2002 | Lin | 438/107 |
| 6,483,718 B2 | 11/2002 | Hashimoto | 361/803 |
| 6,492,252 B1 | 12/2002 | Lin et al. | 438/612 |
| 6,504,241 B1 | 1/2003 | Yanagida | 257/686 |
| 6,576,539 B1 | 6/2003 | Lin | 438/611 |
| 6,653,217 B1 | 11/2003 | Lin | 438/612 |
| 6,740,576 B1 | 5/2004 | Lin et al. | 438/611 |

*Primary Examiner*—Matthew Smith
*Assistant Examiner*—Jarrett J. Stark
(74) *Attorney, Agent, or Firm*—David M. Sigmond

(57) ABSTRACT

A method of making a semiconductor chip assembly includes providing a metal base that includes a metal plate and a metal layer, providing a routing line that contacts the metal layer and an etch mask that contacts the metal plate, providing a semiconductor chip that includes a conductive pad, mechanically attaching the chip to the routing line, electrically connecting the routing line to the pad, and etching the metal base using a first wet chemical that is selective of the metal plate and then a second wet chemical etch that is selective of the metal layer and the etch mask to form a pillar from an unetched portion of the metal base that contacts the routing line.

100 Claims, 22 Drawing Sheets

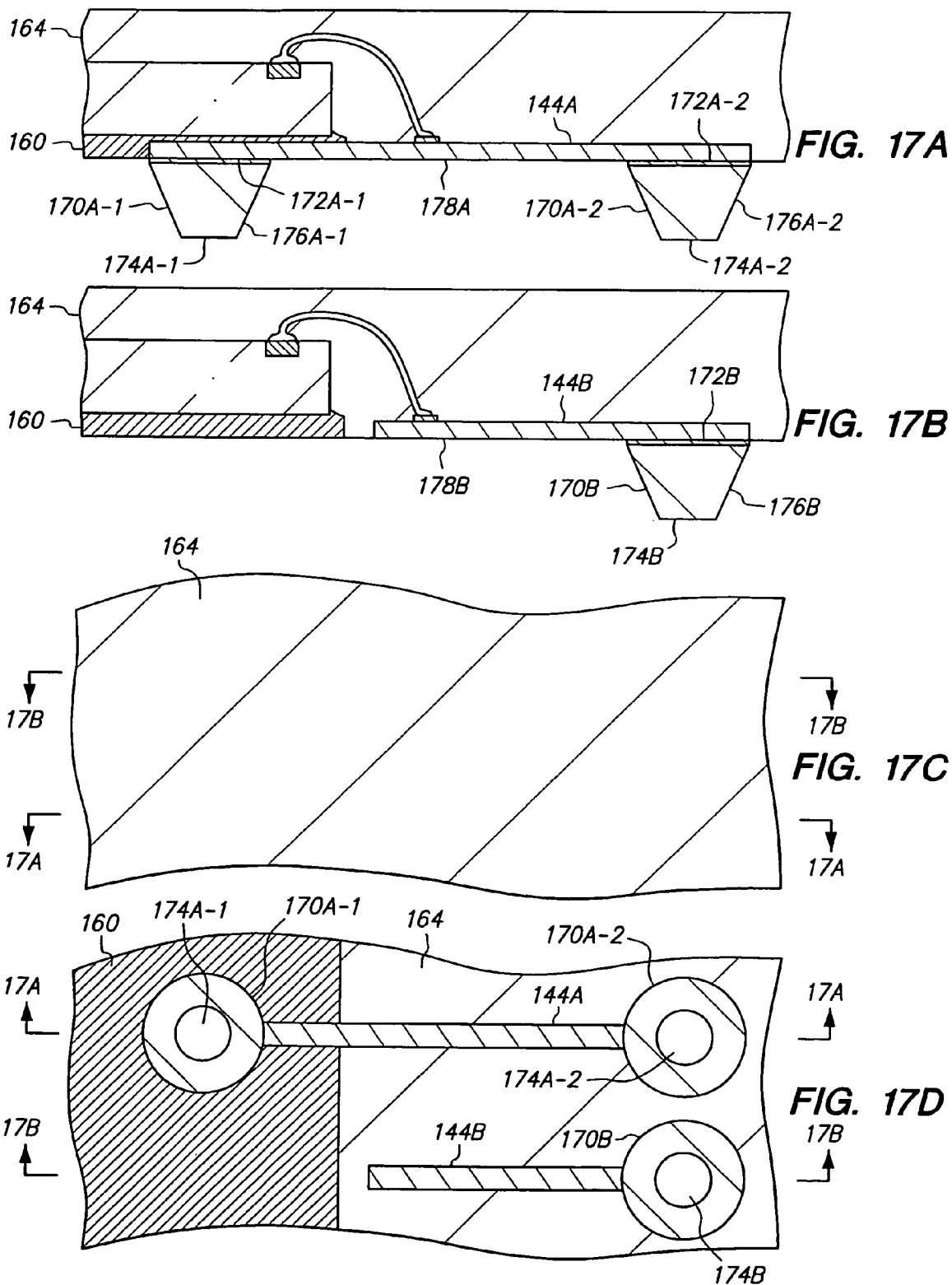

METHOD OF MAKING A SEMICONDUCTOR CHIP ASSEMBLY USING MULTIPLE ETCH STEPS TO FORM A PILLAR AFTER FORMING A ROUTING LINE

CROSS-REFERENCE TO RELATED APPLICATIONS

This application is a continuation of U.S. application Ser. No. 10/889,368 filed Jul. 12, 2004, now U.S. Pat. No. 7,064,012, which is a continuation-in-part of U.S. application Ser. No. 10/866,393 filed Jun. 11, 2004, now U.S. Pat. No. 7,157,791, which is incorporated by reference.

BACKGROUND OF THE INVENTION

1. Field of the Invention

The present invention relates to a semiconductor chip assembly, and more particularly to a method of making a semiconductor chip assembly that includes a semiconductor chip, a pillar and a routing line.

2. Description of the Related Art

Semiconductor chips have power, ground and input/output pads that must be connected to external circuitry in order to function as part of an electronic system. The connection media is typically an array of metallic leads (e.g., a lead frame) or a support circuit (e.g., a substrate), although the connection can be made directly to a circuit panel (e.g., a mother board). Several connection techniques are widely used. These include wire bonding, tape automated bonding (TAB) and flip-chip bonding.

Wire bonding is by far the most common and economical connection technique. In this approach, wires are bonded, one at a time, from the chip to external circuitry by thermocompression, thermosonic or ultrasonic processes. In thermocompression bonding, fine gold wire is fed from a spool through a clamp and a capillary. A thermal source is swept past an end of the wire to form a wire ball that protrudes from the capillary. The chip or capillary is then heated to about 200 to 300° C., the capillary is brought down over an aluminum pad, the capillary exerts pressure on the wire ball, and the wire ball forms a ball bond on the pad. The capillary is then raised and moved to a terminal on the support circuit, the capillary is brought down again, and the combination of force and temperature forms a wedge bond between the wire and the terminal. Thus, the connection between the pad and the terminal includes the ball bond (which only contacts the pad), the wedge bond (which only contacts the terminal) and the wire between the bonds. After raising the capillary again, the wire is ripped from the wedge bond, the thermal source is swept past the wire to form a new wire ball, and the process is repeated for other pads on the chip. Thermosonic bonding is similar to thermocompression bonding but adds ultrasonic vibration as the ball and wedge bonds are formed so that less heat is necessary. Ultrasonic bonding uses aluminum wire to form wedge bonds without applying heat. There are many variations on these basic methods.

TAB involves bonding gold-bumped pads on the chip to external circuitry on a polymer tape using thermocompression bonding. TAB requires mechanical force such as pressure or a burst of ultrasonic vibration and elevated temperature to accomplish metallurgical welding between the wires or bumps and the designated surface.

Flip-chip bonding involves providing pre-formed solder bumps on the pads, flipping the chip so that the pads face down and are aligned with and contact matching bond sites, and melting the solder bumps to wet the pads and the bond sites. After the solder reflows it is cooled down and solidified to form solder joints between the pads and the bond sites. Organic conductive adhesive bumps with conductive fillers in polymer binders have been used in place of solder bumps, but they do not normally form a metallurgical interface in the classical sense. A major advantage of flip-chip bonding over wiring bonding and TAB is that it provides shorter connection paths between the chip and the external circuitry, and therefore has better electrical characteristics such as less inductive noise, cross-talk, propagation delay and waveform distortion. In addition, flip-chip bonding requires minimal mounting area and weight which results in overall cost saving since no extra packaging and less circuit board space are used.

While flip-chip technology has tremendous advantages over wire bonding and TAB, its cost and technical limitations are significant. For instance, the cost of forming bumps on the pads is significant. In addition, an adhesive is normally underfilled between the chip and the support circuit to reduce stress on the solder joints due to thermal mismatch between the chip and the support circuit, and the underfilling process increases both manufacturing complexity and cost.

Other techniques besides wire bonding, TAB and flip-chip technologies have been developed to provide connection joints that electrically connect pads on chips to external conductive traces. These connection joints can be formed by electroplated metal, electrolessly plated metal, solder or conductive adhesive.

Electroplating provides deposition of an adherent metallic coating onto a conductive object placed into an electrolytic bath composed of a solution of the salt of the metal to be plated. Using the terminal as an anode (possibly of the same metal as the one used for plating), a DC current is passed through the solution affecting transfer of metal ions onto the cathode surface. As a result, the metal continually electroplates on the cathode surface. Electroplating using AC current has also been developed. Electroplating is relatively fast and easy to control. However, a plating bus is needed to supply current where electroplating is desired. The plating bus creates design constraints and must be removed after the electroplating occurs. Non-uniform plating may arise at the bottom of relatively deep through-holes due to poor current density distribution. Furthermore, the electrolytic bath is relatively expensive.

Electroless plating provides metal deposition by an exchange reaction between metal complexes in a solution and a catalytic metal that activates or initiates the reaction. As a result, the electroless metal continually plates (i.e., deposits or grows) on the catalytic metal. Advantageously, the reaction does not require externally applied electric current. Therefore, electroless plating can proceed without a plating bus. However, electroless plating is relatively slow. Furthermore, the electroless bath is relatively expensive.

Solder joints are relatively inexpensive, but exhibit increased electrical resistance as well as cracks and voids over time due to fatigue from thermo-mechanical stresses. Further, the solder is typically a tin-lead alloy and lead-based materials are becoming far less popular due to environmental concerns over disposing of toxic materials and leaching of toxic materials into ground water supplies.

Conductive adhesive joints with conductive fillers in polymer binders are relatively inexpensive, but do not normally form a metallurgical interface in the classical sense. Moisture penetration through the polymer binder may induce corrosion or oxidation of the conductive filler particles resulting in an unstable electrical connection. Furthermore, the polymer binder and the conductive filler may degrade leading to an unstable electrical connection. Thus, the conductive adhesive may have adequate mechanical strength but poor electrical characteristics.

Accordingly, each of these connection joint techniques has various advantages and disadvantages. The optimal approach for a given application depends on design, reliability and cost considerations.

The semiconductor chip assembly is subsequently connected to another circuit such as a printed circuit board (PCB) or mother board during next level assembly. Different semiconductor assemblies are connected to the next level assembly in different ways. For instance, ball grid array (BGA) packages contain an array of solder balls, and land grid array (LGA) packages contain an array of metal pads that receive corresponding solder traces on the PCB.

Thermo-mechanical wear or creep of the solder joints that connect the semiconductor chip assembly to the next level assembly is a major cause of failure in most board assemblies. This is because non-uniform thermal expansion and/or contraction of different materials causes mechanical stress on the solder joints.

Thermal mismatch induced solder joint stress can be reduced by using materials having a similar coefficient of thermal expansion (CTE). However, due to large transient temperature differences between the chip and other materials during power-up of the system, the induced solder joint stress makes the assembly unreliable even when the chip and the other materials have closely matched thermal expansion coefficients.

Thermal mismatch induced solder joint stress can also be reduced by proper design of the support circuit. For instance, BGA and LGA packages have been designed with pillar post type contact terminals that extend above the package and act as a stand-off or spacer between the package and the PCB in order to absorb thermal stress and reduce solder joint fatigue. The higher the aspect ratio of the pillar, the more easily the pillar can flex to follow expansion of the two ends and reduce shear stress.

Conventional approaches to forming the pillar either on a wafer or a separate support circuit include a bonded interconnect process (BIP) and plating using photoresist.

BIP forms a gold ball on a pad of the chip and a gold pin extending upwardly from the gold ball using a thermocompression wire bonder. Thereafter, the gold pin is brought in contact with a molten solder bump on a support circuit, and the solder is reflowed and cooled to form a solder joint around the gold pin. A drawback to this approach is that when the wire bonder forms the gold ball on the pad it applies substantial pressure to the pad which might destroy active circuitry beneath the pad. In addition, gold from the pin can dissolve into the solder to form a gold-tin intermetallic compound which mechanically weakens the pin and therefore reduces reliability.

U.S. Pat. No. 5,722,162 discloses fabricating a pillar by electroplating the pillar on a selected portion of an underlying metal exposed by an opening in photoresist and then stripping the photoresist. Although it is convenient to use photoresist to define the location of the pillar, electroplating the pillar in an opening in the photoresist has certain drawbacks. First, the photoresist is selectively exposed to light that initiates a reaction in regions of the photoresist that correspond to the desired pattern. Since photoresist is not fully transparent and tends to absorb the light, the thicker the photoresist, the poorer the penetration efficiency of the light. As a result, the lower portion of the photoresist might not receive adequate light to initiate or complete the intended photo-reaction. Consequently, the bottom portion of the opening in the photoresist might be too narrow, causing a pillar formed in the narrowed opening to have a diameter that decreases with decreasing height. Such a pillar has a high risk of fracturing at its lower portion in response to thermally induced stress. Furthermore, photoresist residue on the underlying metal might cause the pillar to have poor quality or even prevent the pillar from being formed. Second, if the photoresist is relatively thick (such as 100 microns or more), the photoresist may need to be applied with multiple coatings and receive multiple light exposures and bakes, which increases cost and reduces yield. Third, if the photoresist is relatively thick, the electroplated pillar may be non-uniform due to poor current density distribution in the relatively deep opening. As a result, the pillar may have a jagged or pointed top surface instead of a flat top surface that is better suited for providing a contact terminal for the next level assembly.

In view of the various development stages and limitations in currently available semiconductor chip assemblies, there is a need for a semiconductor chip assembly that is cost-effective, reliable, manufacturable, versatile, provides excellent mechanical and electrical properties, and makes advantageous use the particular connection joint technique best suited for a given application.

SUMMARY OF THE INVENTION

An object of the present invention is to provide a semiconductor chip assembly that provides a low cost, high performance, high reliability package.

Another object of the present invention is to provide a convenient, cost-effective method for manufacturing a semiconductor chip assembly.

Generally speaking, the present invention provides a method of making a semiconductor chip assembly that includes providing a metal base that includes a metal plate and a metal layer, providing a routing line that contacts the metal layer and an etch mask that contacts the metal plate, providing a semiconductor chip that includes a conductive pad, mechanically attaching the chip to the routing line, electrically connecting the routing line to the pad, and etching the metal base using a first wet chemical etch that is selective of the metal plate and then a second wet chemical etch that is selective of the metal layer and the etch mask to form a pillar from an unetched portion of the metal base that contacts the routing line.

The method can include providing the metal base with first and second opposing surfaces, wherein the metal layer provides the first surface of the metal base, the metal plate provides the second surface of the metal base, the routing line contacts the first surface of the metal base and the etch mask contacts the second surface of the metal base.

The method can include simultaneously depositing the metal layer and the etch mask on the metal plate and then depositing the routing line on the metal layer.

The method can include providing the metal plate with first and second opposing surfaces, then depositing the metal layer on the first surface of the metal plate and the etch mask on the second surface of the metal plate, and then depositing the routing line on the metal layer.

The method can include providing a first plating mask on the second surface of the metal plate, wherein the first plating mask includes an opening that exposes a portion of the second surface of the metal plate, simultaneously electroplating the metal layer on the first surface of the metal plate and the etch mask on the exposed portion of the second surface of the metal plate through the opening in the first plating mask, removing the first plating mask, providing a second plating mask on the first surface of metal base (the metal layer) and a third plating mask on the second surface of the metal base (the metal plate) and the etch mask, wherein the second plating mask includes an opening that exposes a portion of the first surface of the metal base, and the third plating mask covers the etch mask, electroplating the routing line on the exposed portion of the first surface of the metal base through the opening in the third plating mask, and removing the second and third plating masks.

The method can include etching the metal base such that an unetched portion of the metal base defined by the etch mask forms the pillar.

The method can include etching the metal base to form the pillar, thereby etching through the metal base, removing a first portion of the metal base that contacts the routing line without removing a second portion of the metal base that contacts the routing line, reducing but not eliminating contact area between the metal base and the routing line, removing most of the metal base and exposing the routing line.

The method can include etching the metal base to form the pillar, thereby electrically isolating the routing line from other routing lines that contact the metal base, and electrically isolating the pad from other conductive pads of the chip.

The method can include etching the metal base using the first wet chemical etch that is selective of the metal plate with respect to the metal layer and the etch mask, and etches through the metal plate thereby exposing the metal layer without exposing the routing line.

The method can include etching the metal base using the second wet chemical etch that is selective of the metal plate and the routing line, etches through the metal layer thereby exposing the routing line, and removes the etch mask.

The method can include mechanically attaching the chip to the routing line using an adhesive. For instance, the method can include depositing an adhesive on the metal base, then placing the chip on the adhesive, and then hardening the adhesive.

The method can include forming a connection joint that electrically connects the routing line and the pad. The connection joint can be electroplated metal, electrolessly plated metal, solder, conductive adhesive, a wire bond or a stud bump.

The method can include forming an encapsulant that contacts and covers the chip after mechanically attaching the chip to the routing line. The encapsulant can also cover the routing line.

The method can include depositing an insulative base over the pillar and the routing line after mechanically attaching the chip to the routing line, then hardening the insulative base, and then removing a portion of the insulative base thereby exposing the pillar without exposing the routing line. The portion of the insulative base can be removed by laser ablation, plasma etching, grinding or photolithography.

The method can include etching the metal base to form the pillar before or after mechanically attaching the chip to the routing line, before or after electrically connecting the routing line to the pad, and before or after forming the encapsulant.

The method can include depositing the routing line and the etch mask on the metal base, then mechanically attaching the chip to the metal base and the routing line, and then etching the metal base to form the pillar.

The method can include depositing the routing line and the etch mask on the metal base, then etching the metal base to form the pillar, and then mechanically attaching the chip to the pillar and the routing line.

The method can include depositing the routing line and the etch mask on the metal base, then mechanically attaching the chip to the metal base and the routing line and electrically connecting the routing line to the pad, then forming the encapsulant, and then etching the metal base to form the pillar.

The method can include depositing the routing line and the etch mask on the metal base, then etching the metal base to form the pillar, then mechanically attaching the chip to the pillar and the routing line and electrically connecting the routing line to the pad, and then forming the encapsulant.

The method can include depositing the routing line and the etch mask on the metal base, then mechanically attaching the chip to the metal base and the routing line, then electrically connecting the routing line to the pad, then forming the encapsulant, and then etching the metal base to form the pillar.

The method can include depositing the routing line and the etch mask on the metal base, then etching the metal base to form the pillar, then mechanically attaching the chip to the pillar and the routing line, then electrically connecting the routing line to the pad, and then forming the encapsulant.

The method can include depositing the routing line and the etch mask on the metal base, then mechanically attaching the chip to the metal base and the routing line, then forming the encapsulant, then etching the metal base to form the pillar, and then electrically connecting the routing line to the pad.

The method can include depositing the routing line and the etch mask on the metal base, then etching the metal base to form the pillar, then mechanically attaching the chip to the pillar and the routing line, then forming the encapsulant, and then electrically connecting the routing line to the pad.

In accordance with another aspect of the present invention, the method includes depositing the routing line and first and second etch masks on the metal base, then mechanically attaching the chip to the routing line, electrically connecting the routing line to the pad, and etching the metal base using the first and second wet chemical etches, wherein a first unetched portion of the metal base defined by the first etch mask forms a first pillar that contacts the routing line, and a second unetched portion of the metal base defined by the second etch mask forms a second pillar that contacts the routing line.

In this aspect of the invention, the method can include simultaneously electroplating the metal layer and the first and second etch masks on the metal plate, and then electroplating the routing line on the metal layer.

In this aspect of the invention, the method can include etching the metal base to remove a first portion of the metal base that contacts the routing line without removing second and third portions of the metal base that contact the routing line, thereby reducing but not eliminating contact area between the metal base and the routing line and exposing the routing line.

In this aspect of the invention, the method can include depositing the insulative base over the first and second pillars and the routing line, then hardening the insulative base, and then removing a portion of the insulative base thereby exposing the first and second pillars without exposing the routing line.

In accordance with another aspect of the present invention, the method includes depositing first and second routing lines and first and second etch masks on the metal base, providing the chip with first and second conductive pads, then mechanically attaching the chip to the first and second routing lines, electrically connecting the first routing line to the first pad, electrically connecting the second routing line to the second pad, and etching the metal base using the first and second wet chemical etches, wherein a first unetched portion of the metal base defined by the first etch mask forms a first pillar that contacts the first routing line, and a second unetched portion of the metal base defined by the second etch mask forms a second pillar that contacts the second routing line.

In this aspect of the invention, the method can include simultaneously electroplating the metal layer and the first and second etch masks on the metal plate, and then simultaneously electroplating the first and second routing lines on the metal layer.

In this aspect of the invention, the method can include etching the metal base to remove portions of the metal base that contact the first and second routing lines without removing other portions of the metal base that contact the first and second routing lines, thereby reducing but not eliminating contact area between the metal base and the first and second routing lines, exposing the first and second routing lines and electrically isolating the first and second routing lines from one another.

In this aspect of the invention, the method can include forming the encapsulant to contact and cover the chip and cover the first and second routing lines. The method can also include depositing the insulative base over the first and second pillars and the first and second routing lines, then hardening the insulative base, and then removing a portion of the insulative base thereby exposing the first and second pillars without exposing the first and second routing lines.

In accordance with another aspect of the present invention, the method includes depositing first and second routing lines and first and second etch masks on the metal base, providing a first chip with a first conductive pad and a second chip with a second conductive pad, then mechanically attaching the first chip to the first routing line, mechanically attaching the second chip to the second routing line, electrically connecting the first routing line to the first pad, electrically connecting the second routing line to the second pad, and etching the metal base using the first and second wet chemical etches, wherein a first unetched portion of the metal base defined by the first etch mask forms a first pillar that contacts the first routing line, and a second unetched portion of the metal base defined by the second etch mask forms a second pillar that contacts the second routing line.

In this aspect of the invention, the method can include simultaneously electroplating the metal layer and the first and second etch masks on the metal plate, and then simultaneously electroplating the first and second routing lines on the metal layer.

In this aspect of the invention, the method can include etching the metal base to remove portions of the metal base that contact the first and second routing lines without removing other portions of the metal base that contact the first and second routing lines, thereby reducing but not eliminating contact area between the metal base and the first and second routing lines, exposing the first and second routing lines and electrically isolating the first and second routing lines from one another.

In this aspect of the invention, the method can include forming the encapsulant to contact and cover the first and second chips and cover the first and second routing lines. The method can also include depositing the insulative base over the first and second pillars and the first and second routing lines, then hardening the insulative base, and then removing a portion of the insulative base thereby exposing the first and second pillars without exposing the first and second routing lines.

The assembly can be a first-level package.

An advantage of the present invention is that the semiconductor chip assembly can be manufactured conveniently and cost-effectively. Another advantage is that the encapsulant can be provided before the metal base is etched, thereby enhancing mechanical support and protection for the routing line after the pillar is formed. Another advantage is that the pillar can be formed using etching (i.e., subtractively) rather than by electroplating or electroless plating (i.e., additively) which improves uniformity and reduces manufacturing time and cost. Another advantage is that the assembly can include a connection joint made from a wide variety of materials and processes, thereby making advantageous use of mature connection joint technologies in a unique and improved manufacturing approach. Another advantage is that the assembly can be manufactured using low temperature processes which reduces stress and improves reliability. A further advantage is that the assembly can be manufactured using well-controlled processes which can be easily implemented by circuit board, lead frame and tape manufacturers. Still another advantage is that the assembly can be manufactured using materials that are compatible with copper chip and lead-free environmental requirements.

These and other objects, features and advantages of the invention will be further described and more readily apparent from a review of the detailed description of the preferred embodiments which follows.

BRIEF DESCRIPTION OF THE DRAWINGS

The following detailed description of the preferred embodiments can best be understood when read in conjunction with the following drawings, in which:

FIGS. 1A–22A are cross-sectional views showing a method of making a semiconductor chip assembly in accordance with an embodiment of the present invention;

FIGS. 1B–22B are cross-sectional views corresponding to FIGS. 1A–22A, respectively;

FIGS. 1C–22C are top plan views corresponding to FIGS. 1A–22A and 1B–22B, respectively; and FIGS. 1D–22D are bottom plan views corresponding to FIGS. 1A–22A and 1B–22B, respectively.

DETAILED DESCRIPTION OF THE PREFERRED EMBODIMENTS

FIGS. 1A–22A, 1B–22B, 1C–22C and 1D–22D are cross-sectional, cross-sectional, top and bottom views, respectively, of a method of making a semiconductor chip assembly in accordance with an embodiment of the present invention.

Figure 1A:
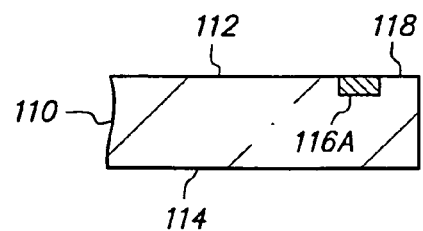
Figure 1B:
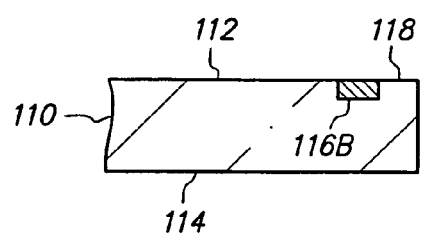
Figure 1C:
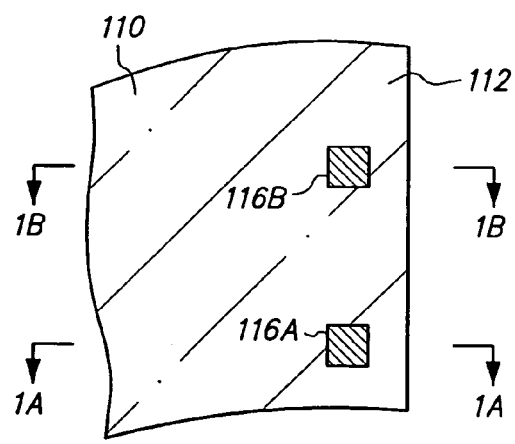
Figure 1D:
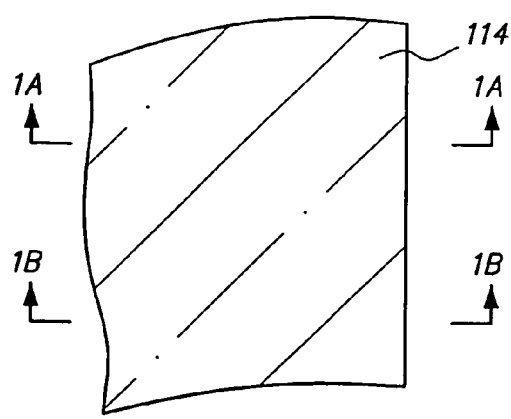
Figure 2A:
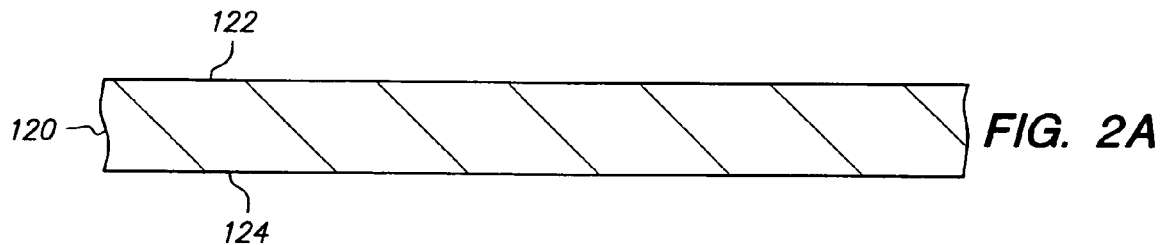
Figure 2B:
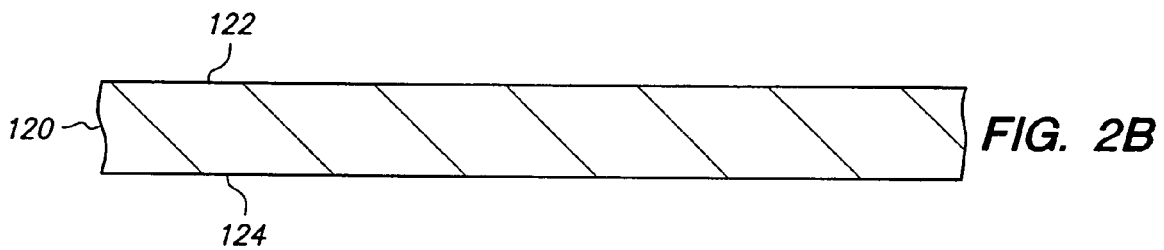
Figure 2C:
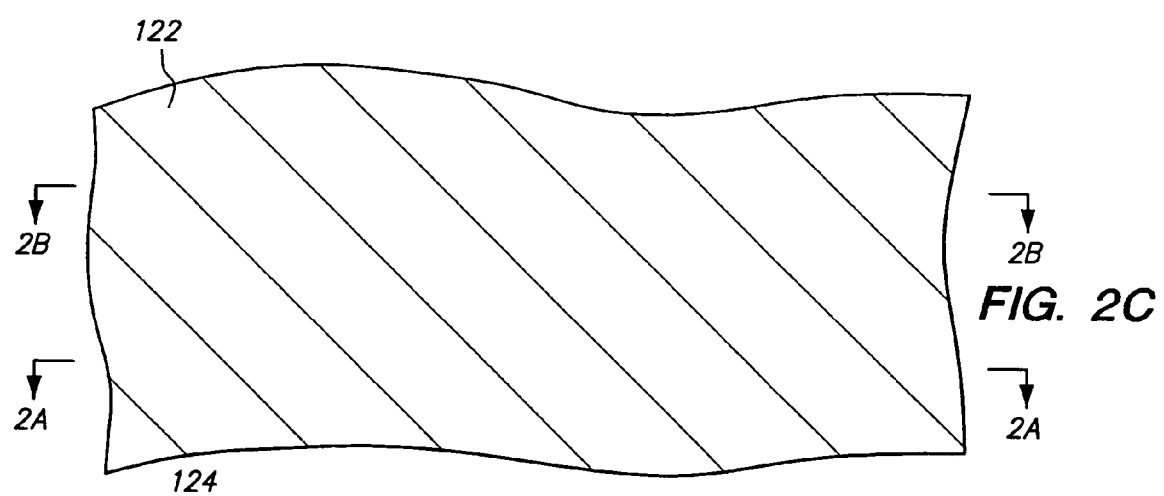
Figure 2D:
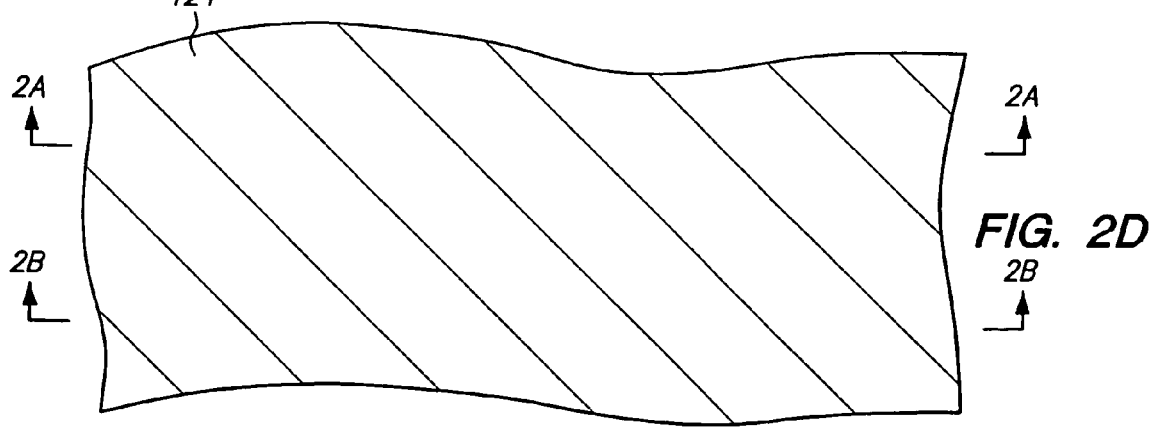
Figure 3A:
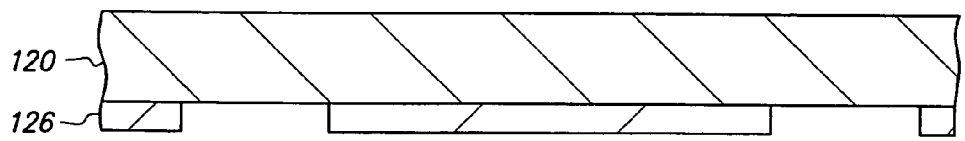
Figure 3B:
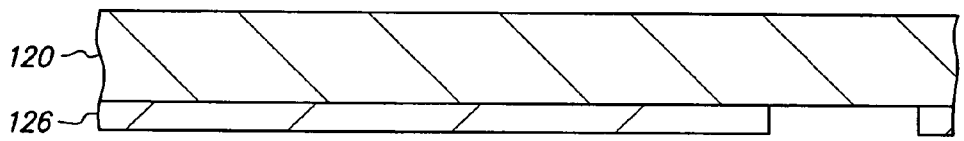
Figure 3C:
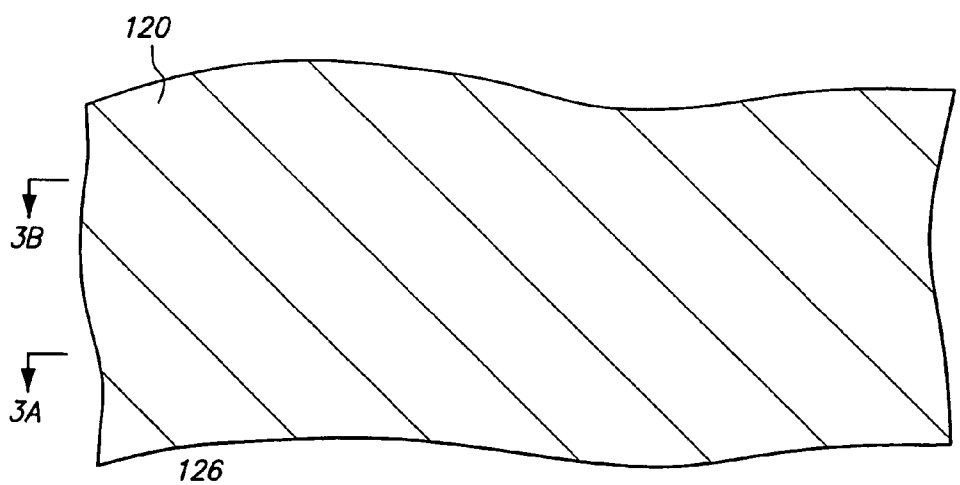
Figure 3D:
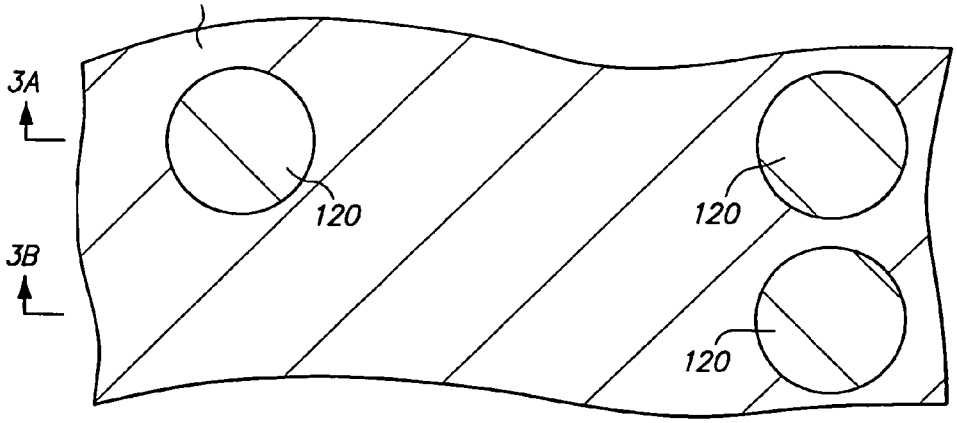
Figure 4A:
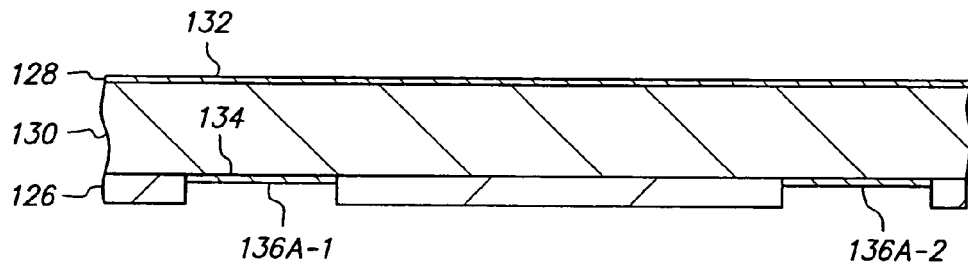
Figure 4B:
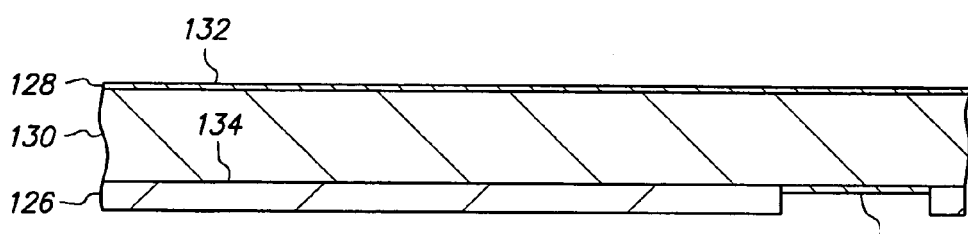
Figure 4C:
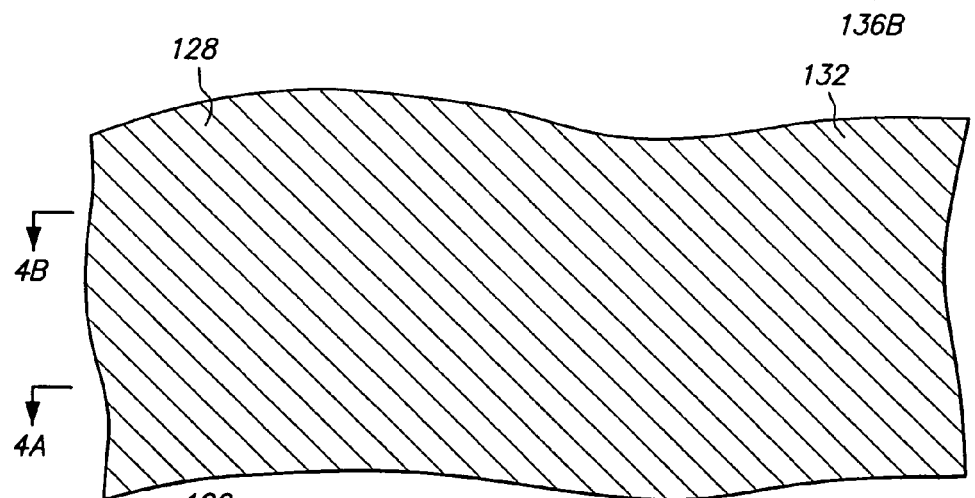
Figure 4D:
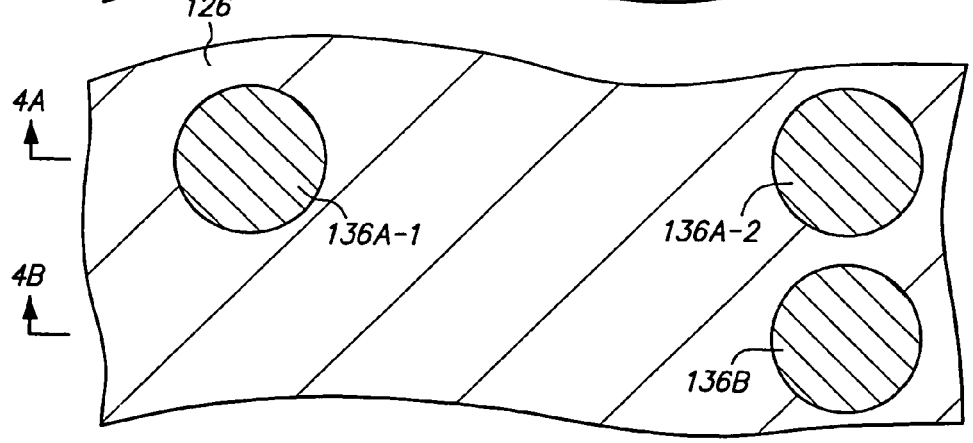
Figure 5A:
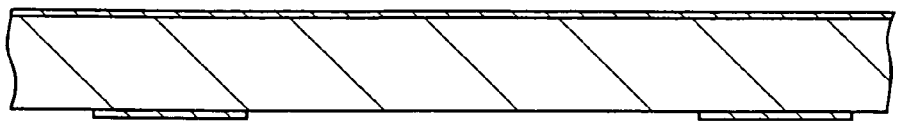
Figure 5B:
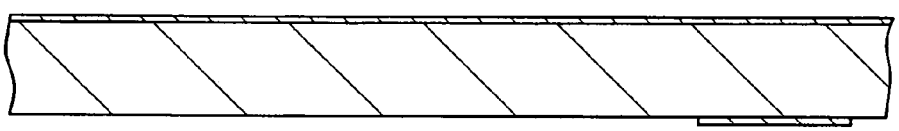
Figure 5C:
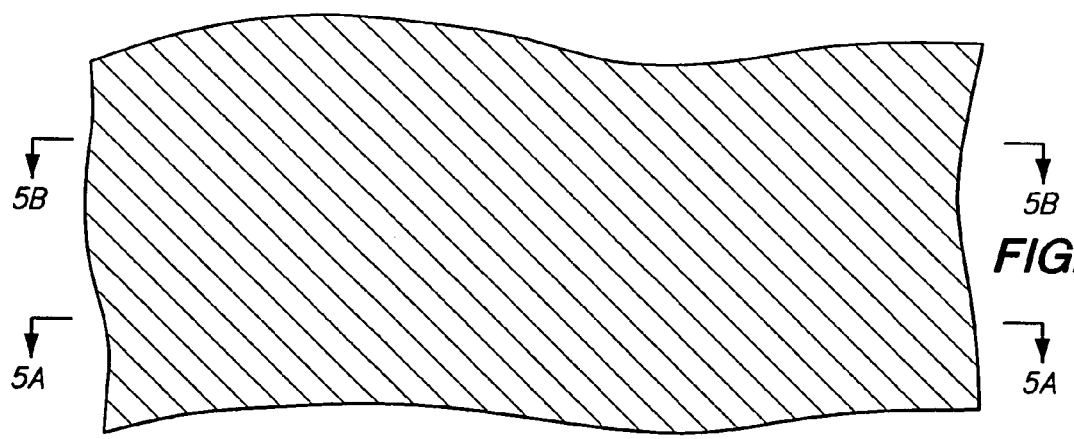
Figure 5D:
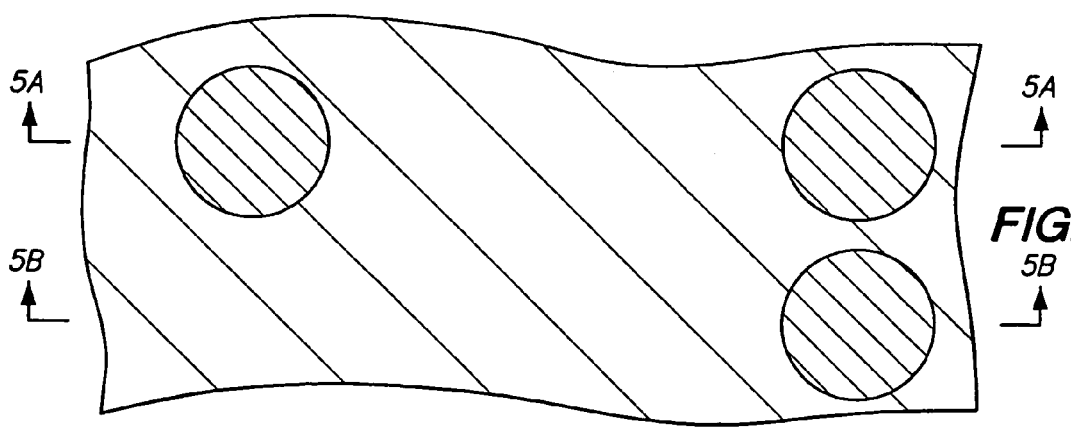
Figure 6A:
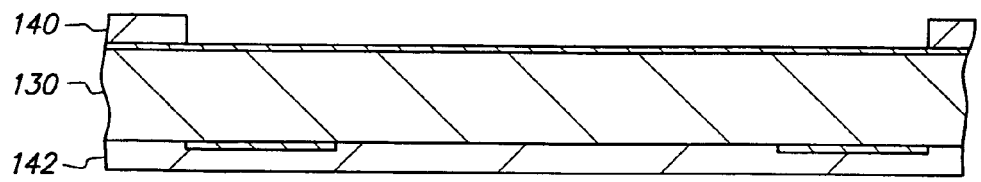
Figure 6B:
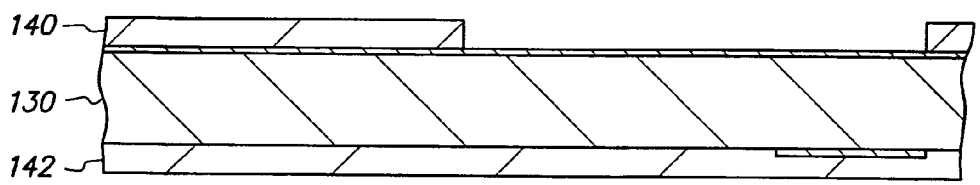
Figure 6C:
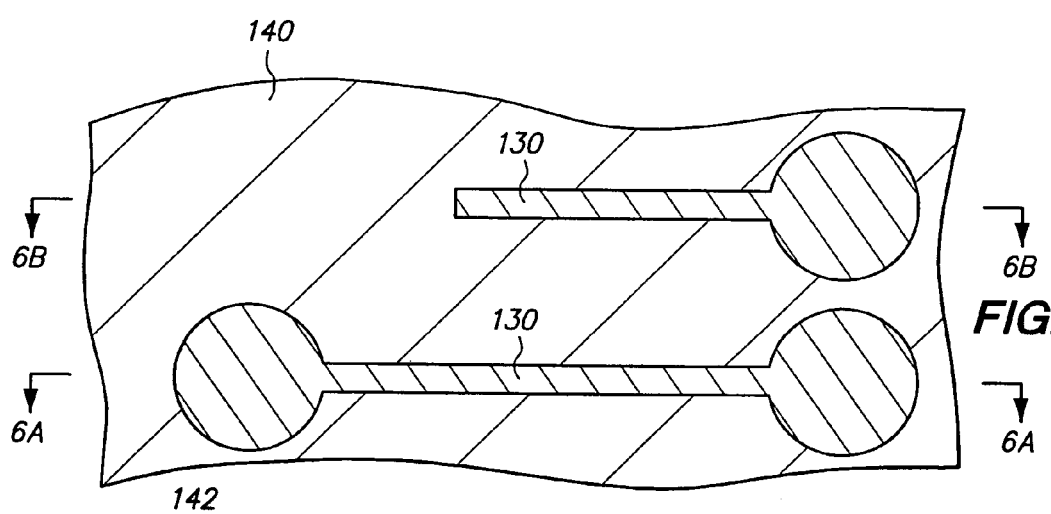
Figure 6D:
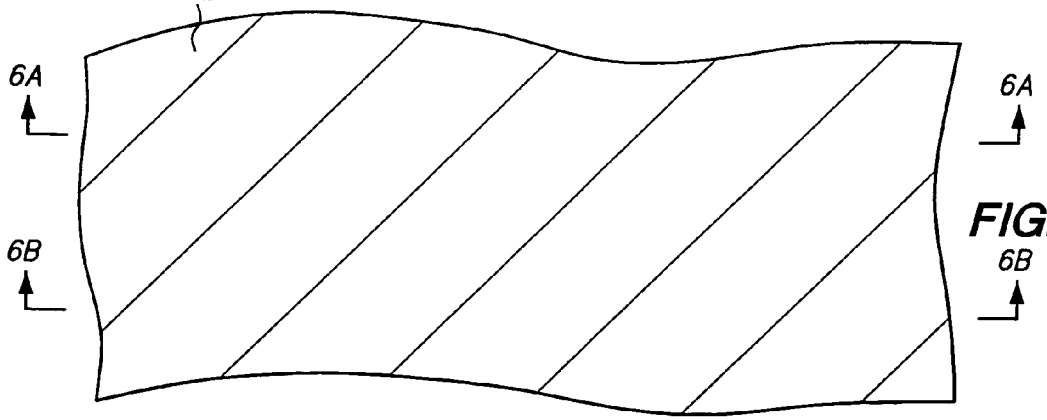
Figure 7A:
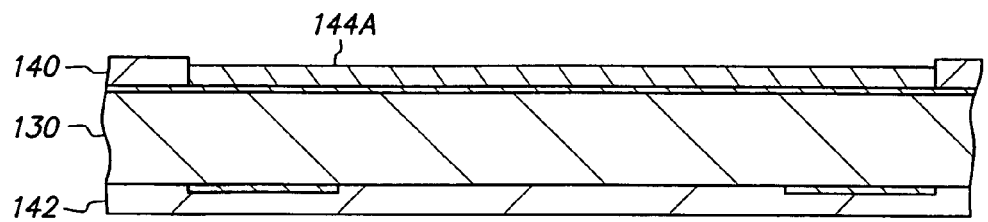
Figure 7B:
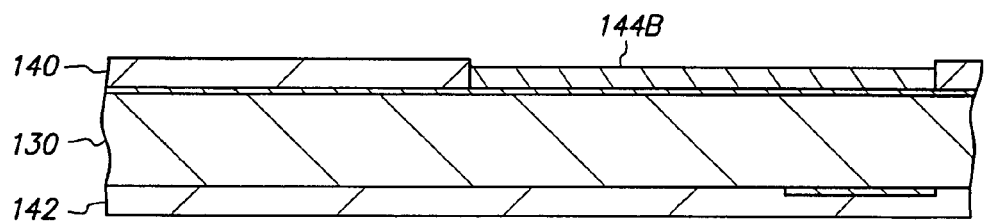
Figure 7C:
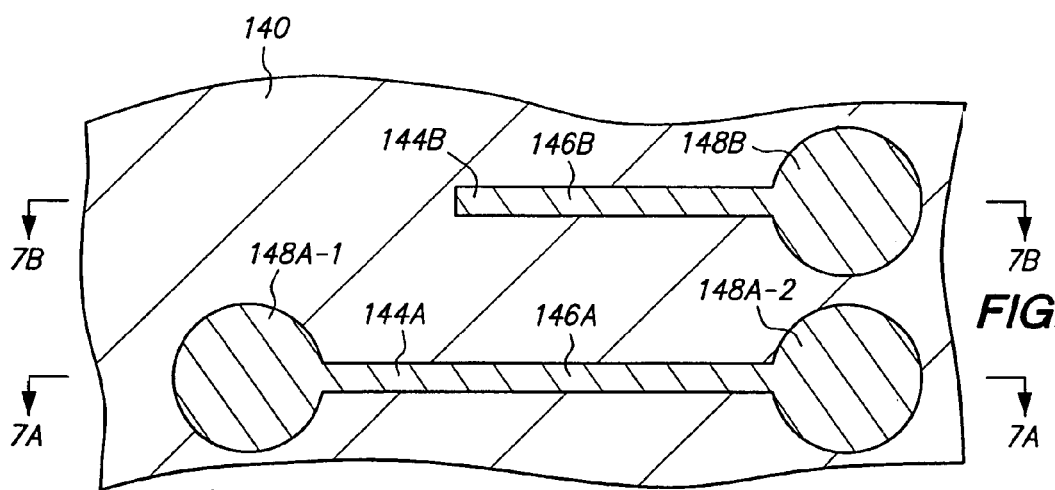
Figure 7D:
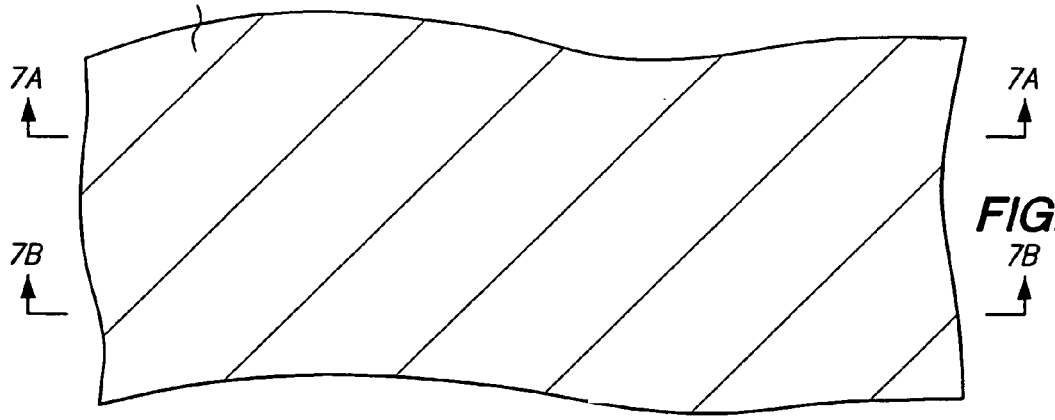
Figure 8A:
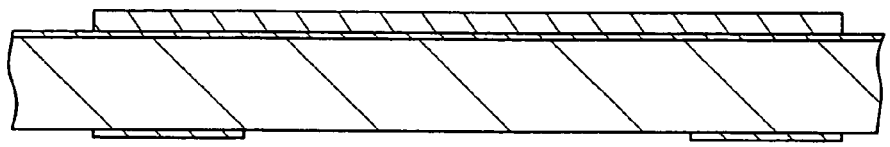
Figure 8B:
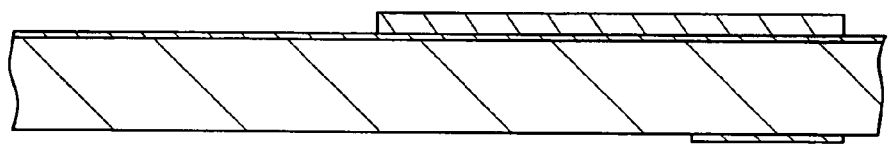
Figure 8C:
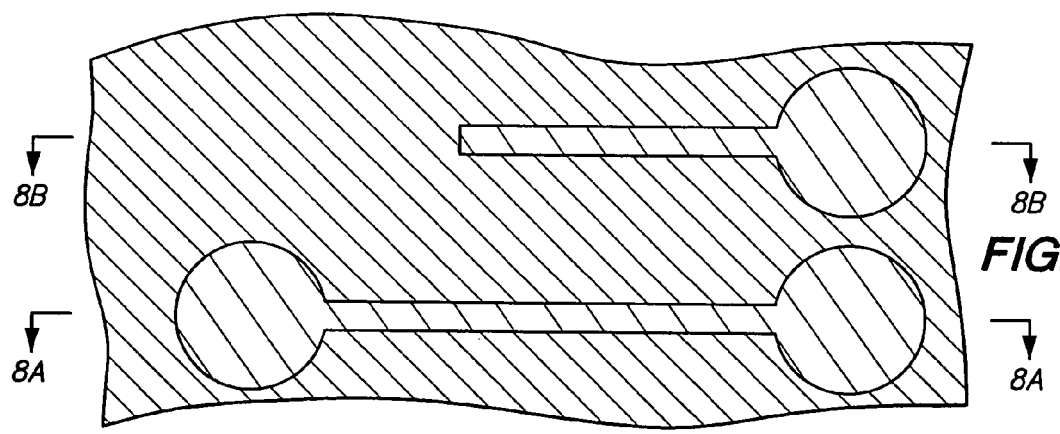
Figure 8D:
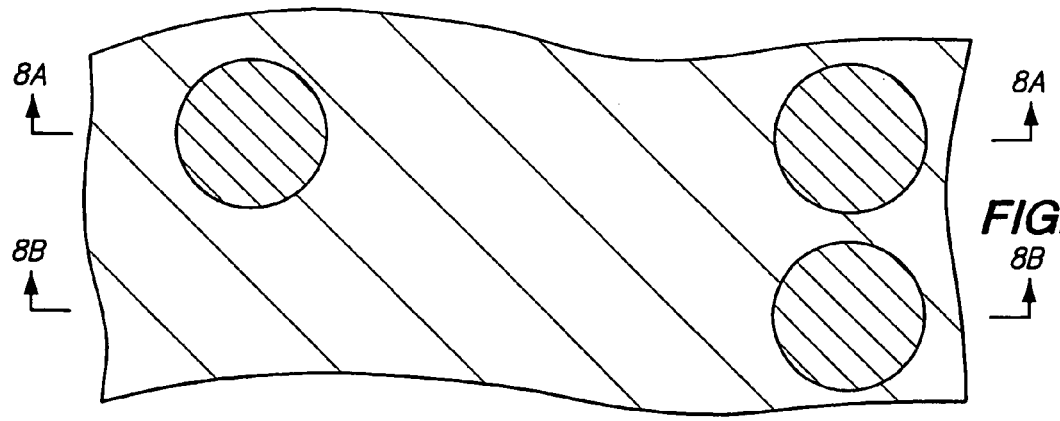
Figure 9A:
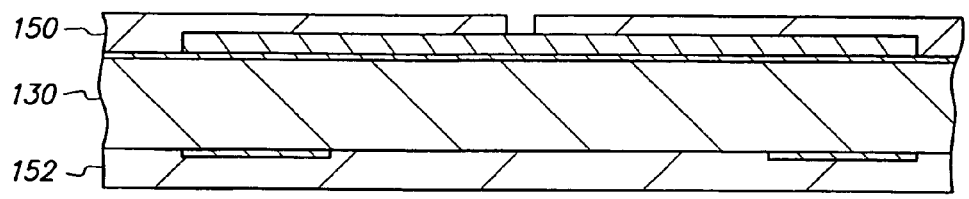
Figure 9B:
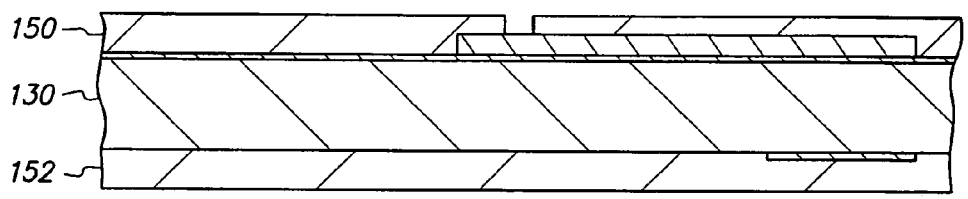
Figure 9C:
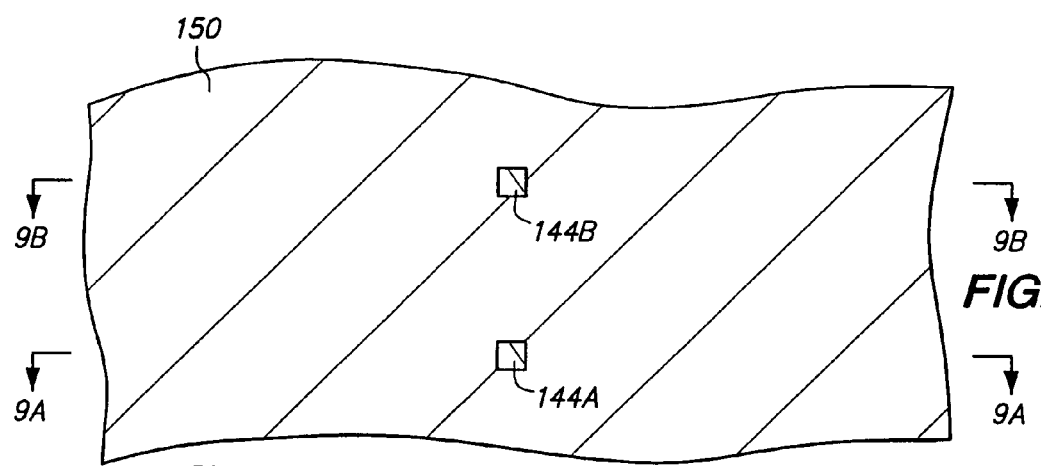
Figure 9D:
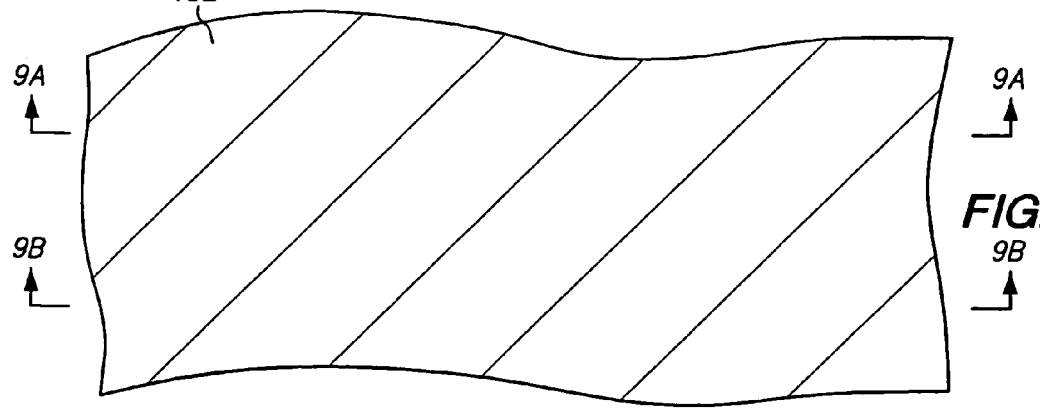
Figure 10A:
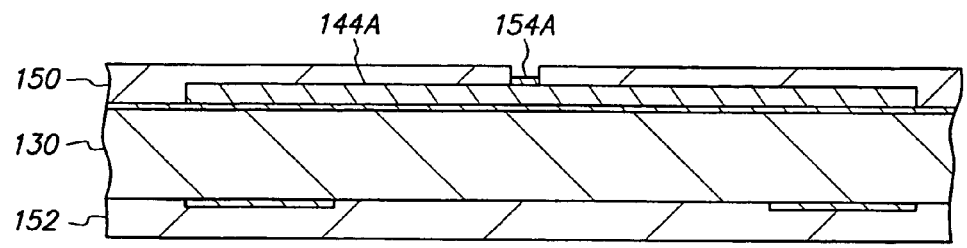
Figure 10B:
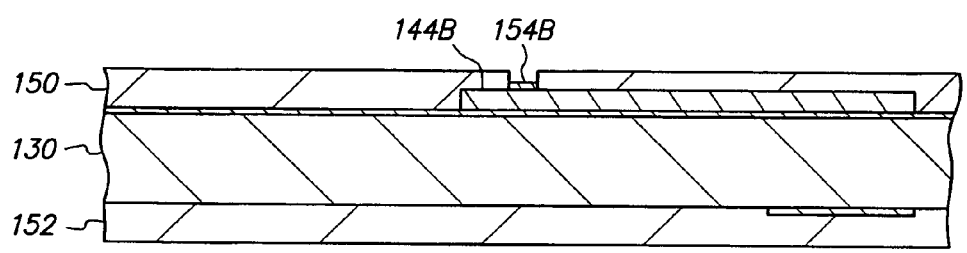
Figure 10C:
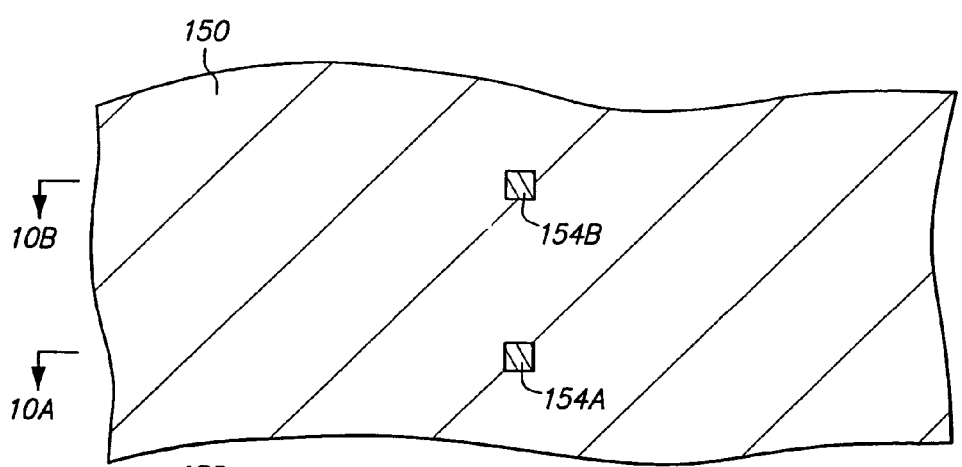
Figure 10D:
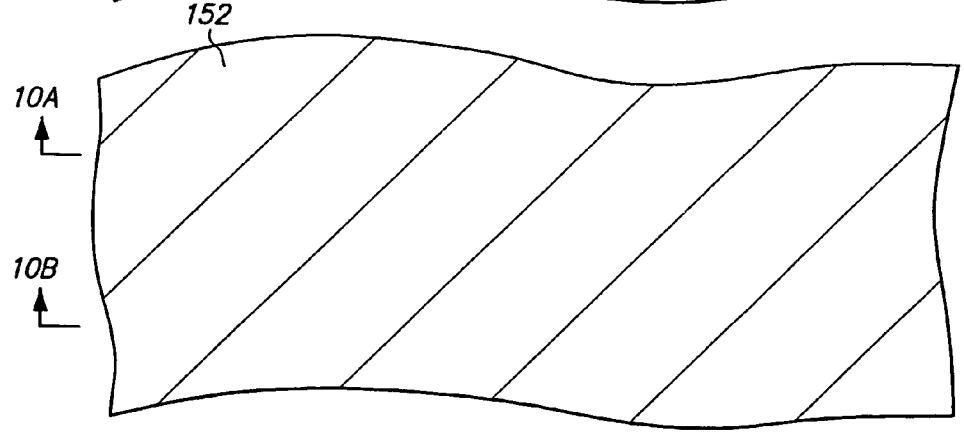
Figure 11A:
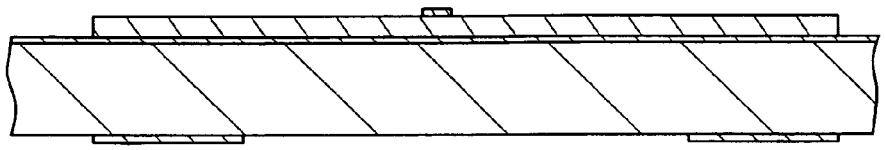
Figure 11B:
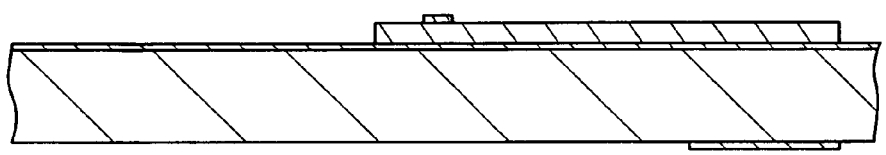
Figure 11C:
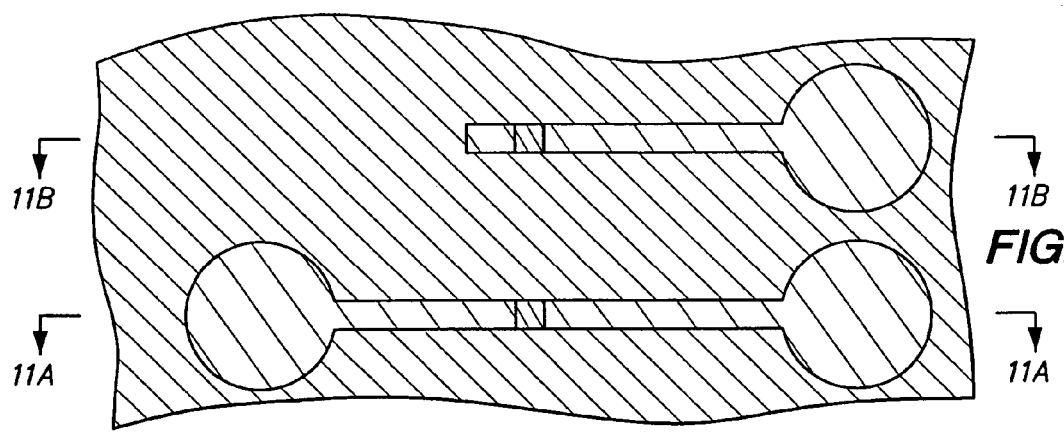
Figure 11D:
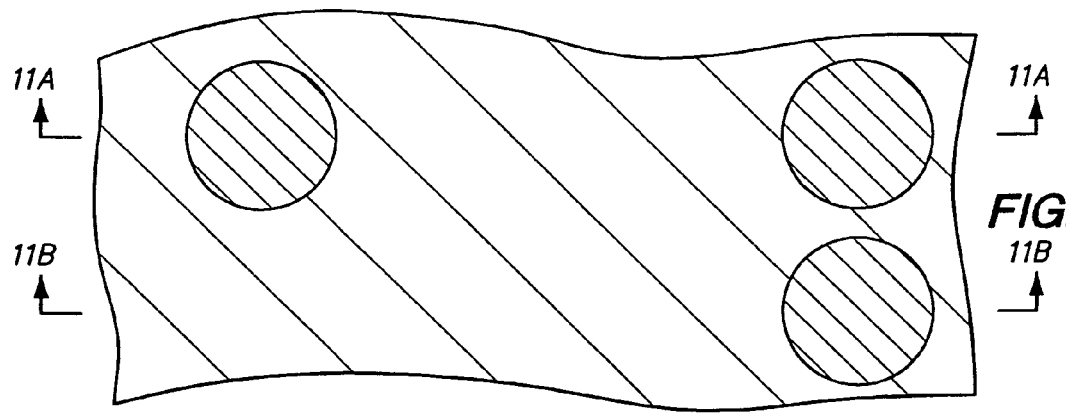
Figure 12A:
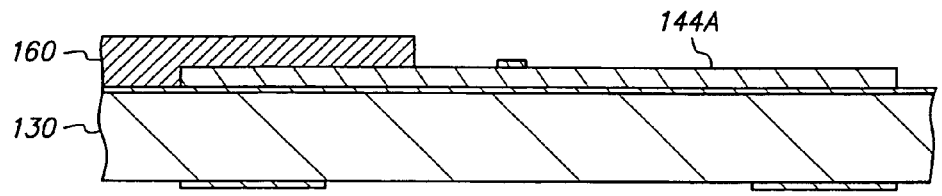
Figure 12B:
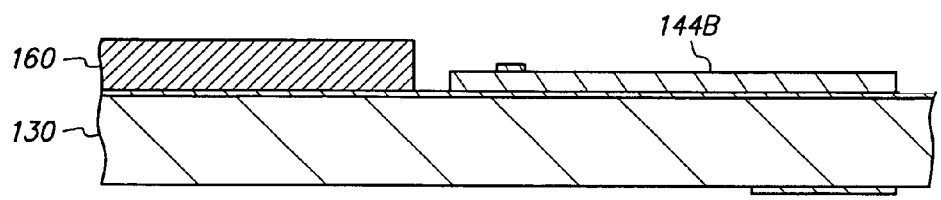
Figure 12C:
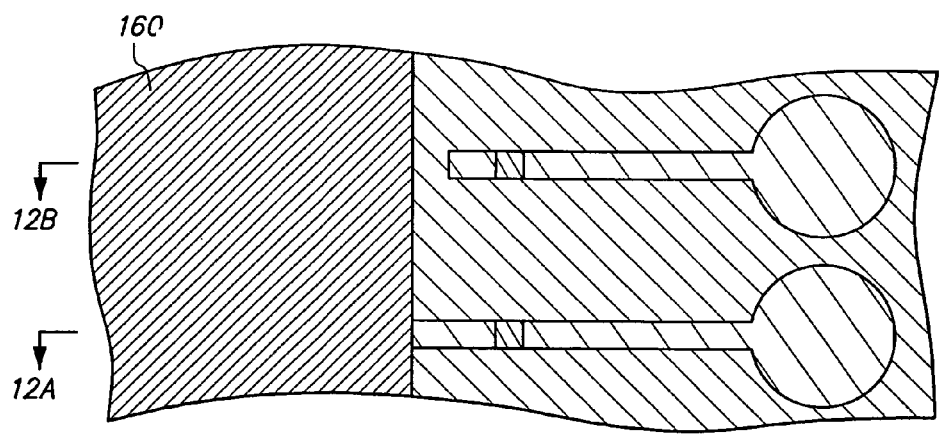
Figure 12D:
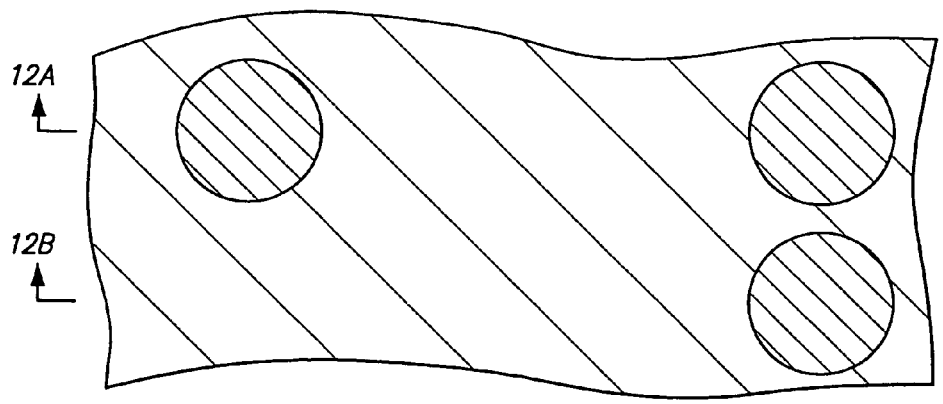
Figure 13A:
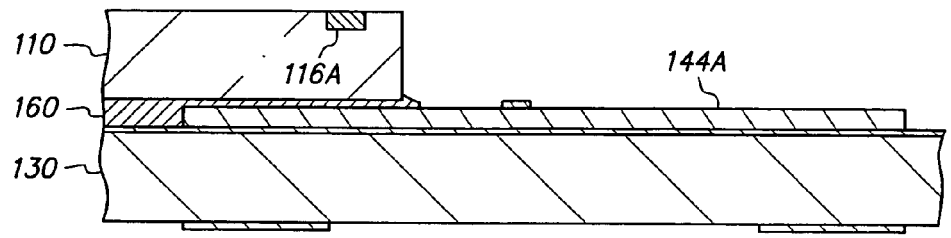
Figure 13B:
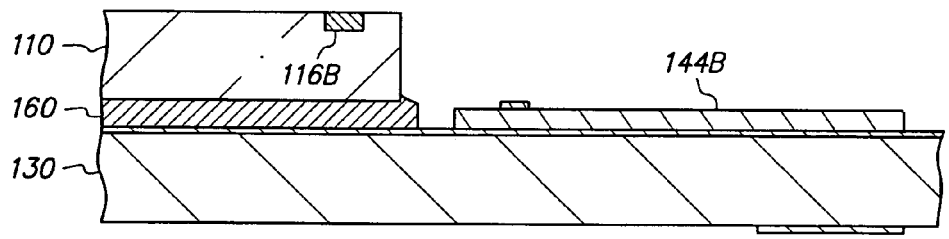
Figure 13C:
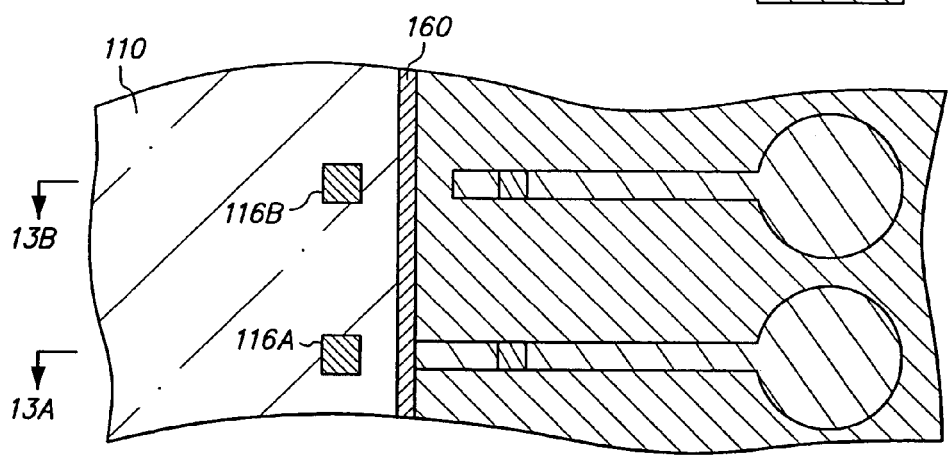
Figure 13D:
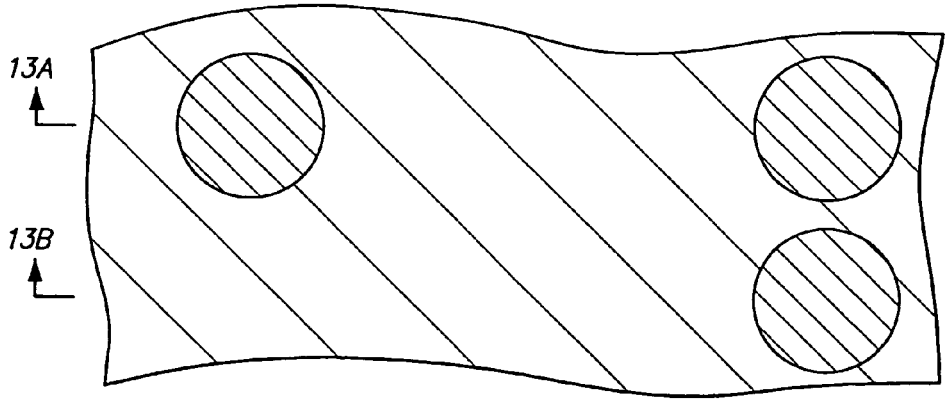
Figure 14A:
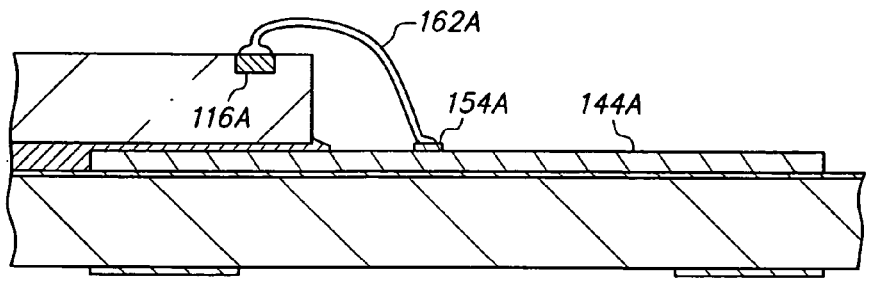
Figure 14B:
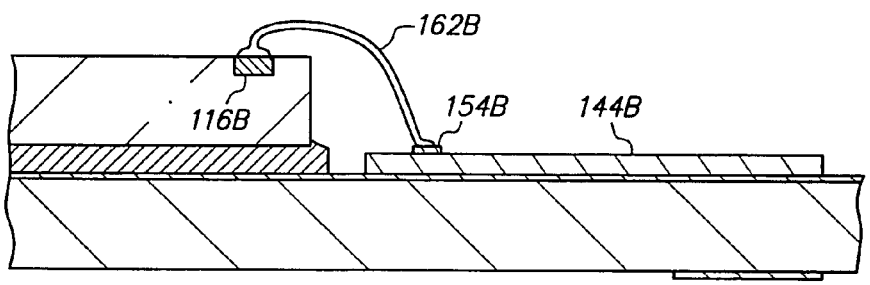
Figure 14C:
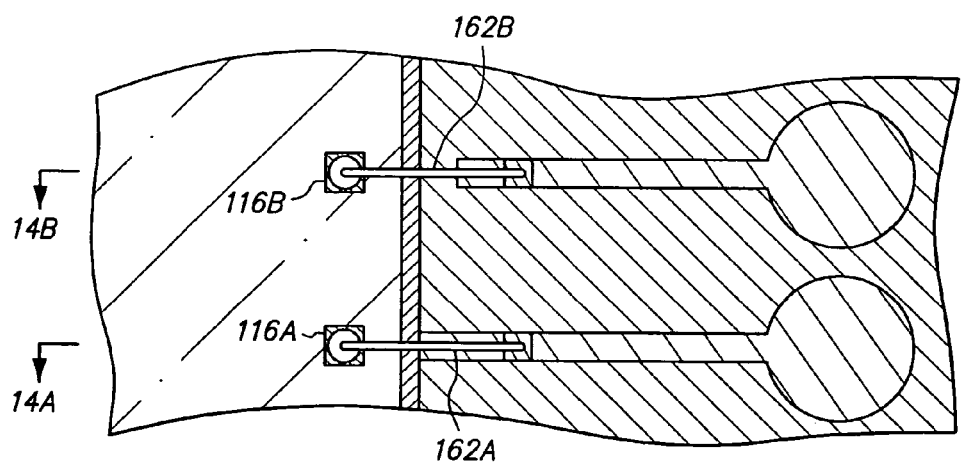
Figure 14D:
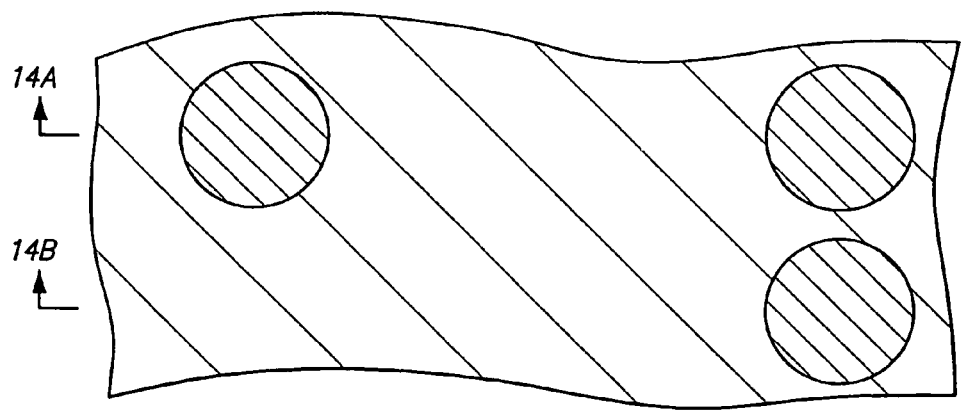
Figure 15A:
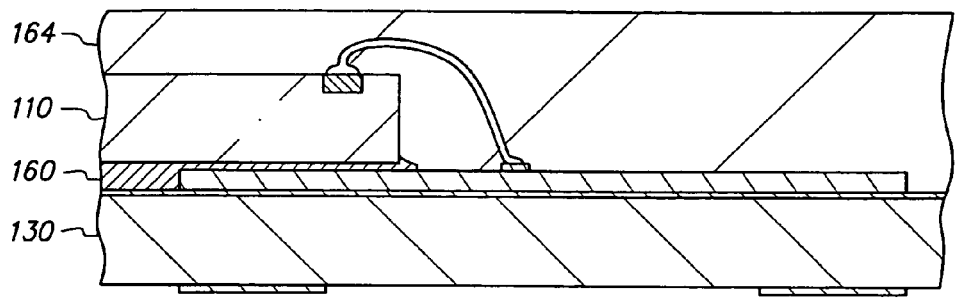
Figure 15B:
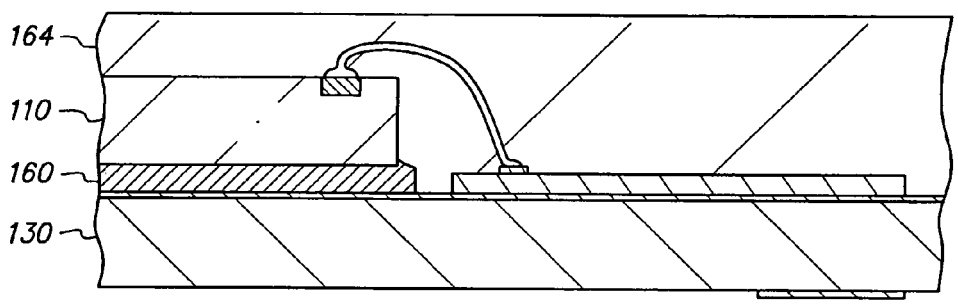
Figure 15C:
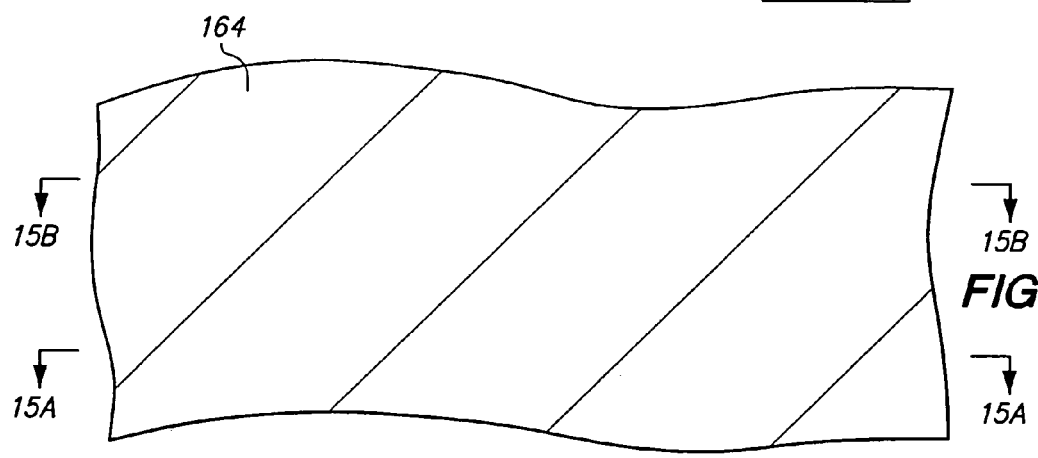
Figure 15D:
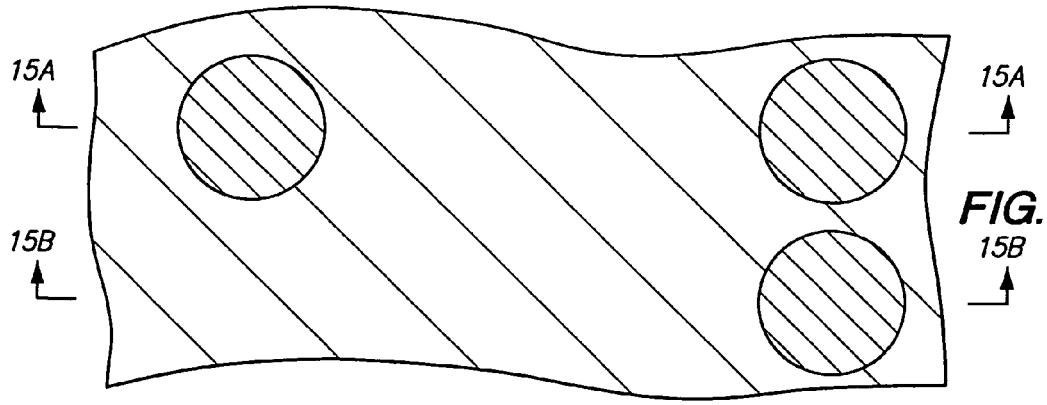
Figure 16A:
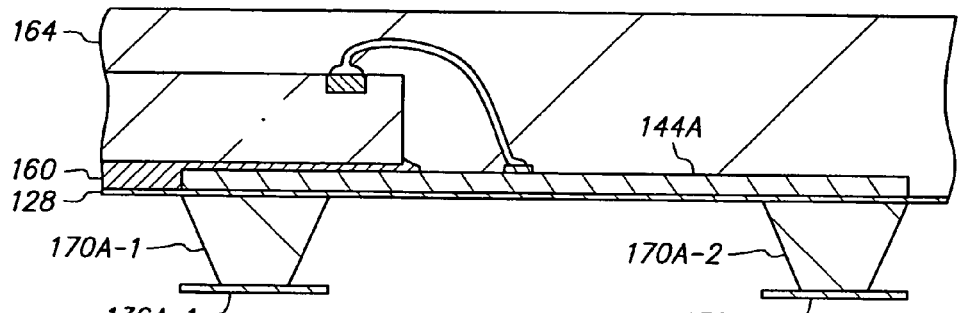
Figure 16B:
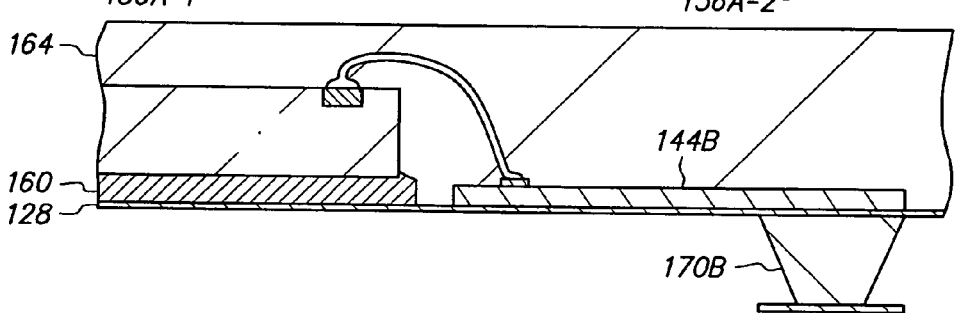
Figure 16C:
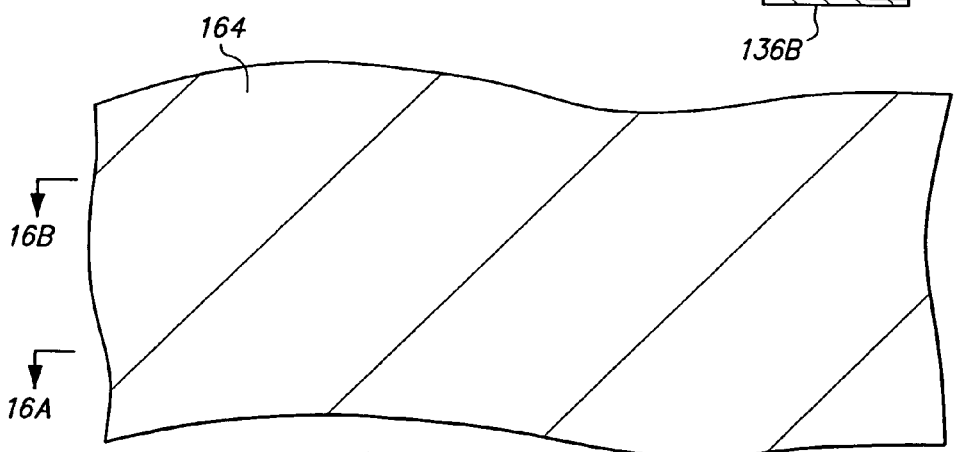
Figure 16D:
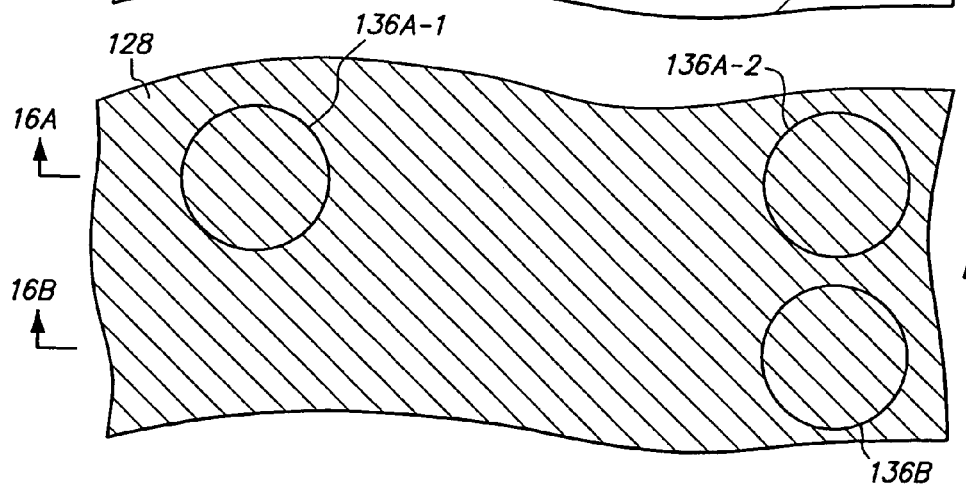
Figure 18A:
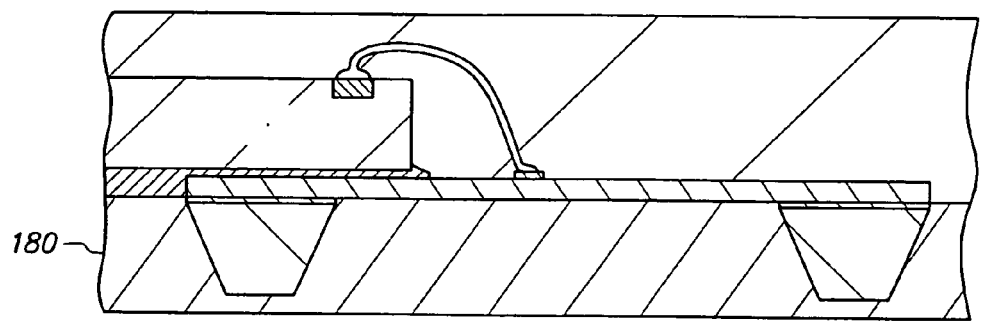
Figure 18B:
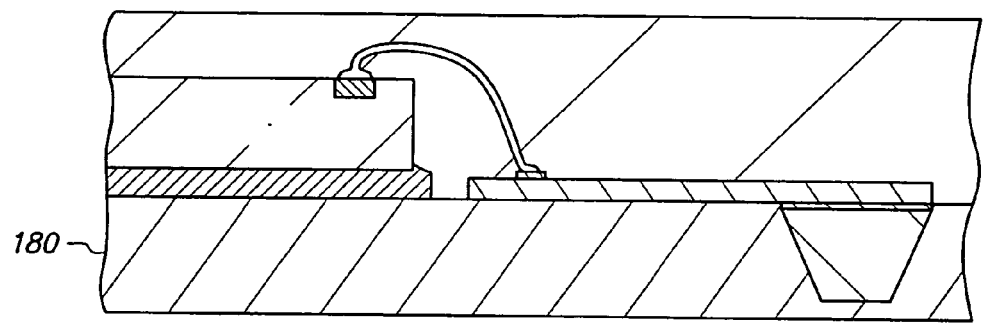
Figure 18C:
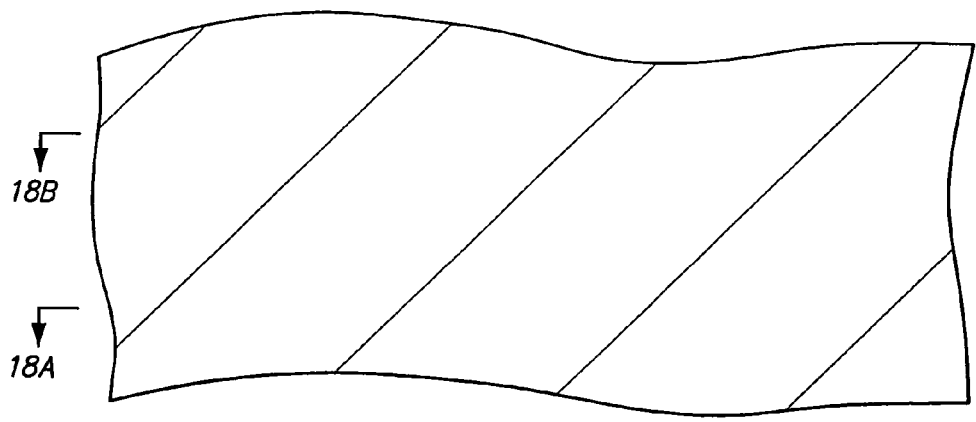
Figure 18D:
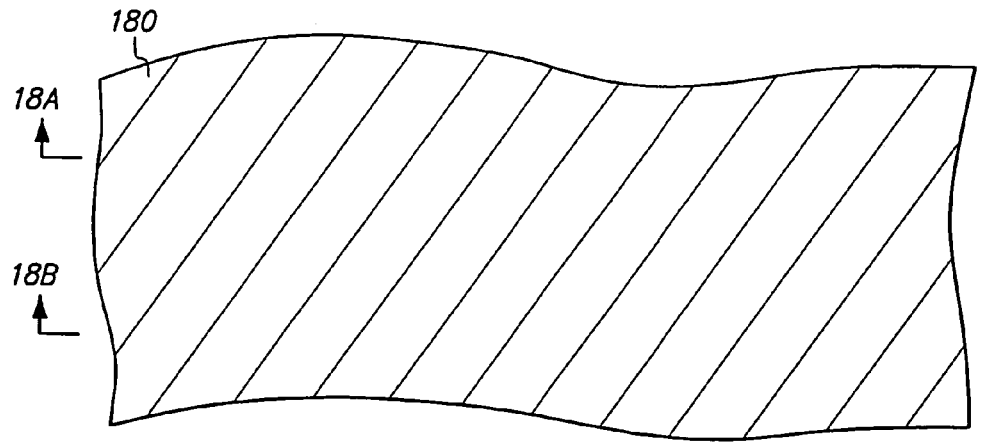
Figure 19A:
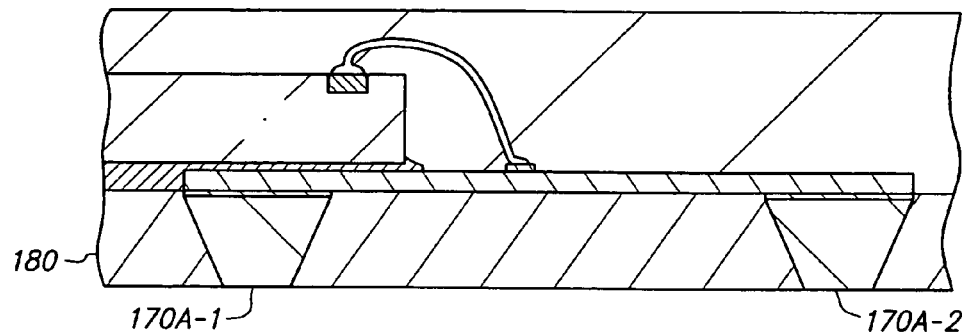
Figure 19B:
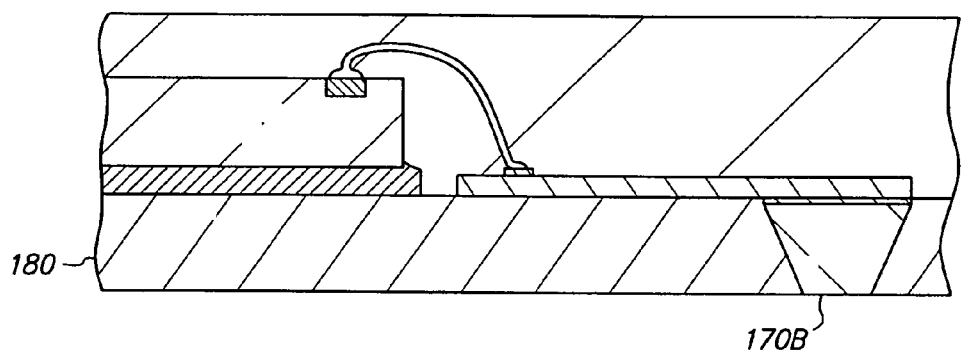
Figure 19C:
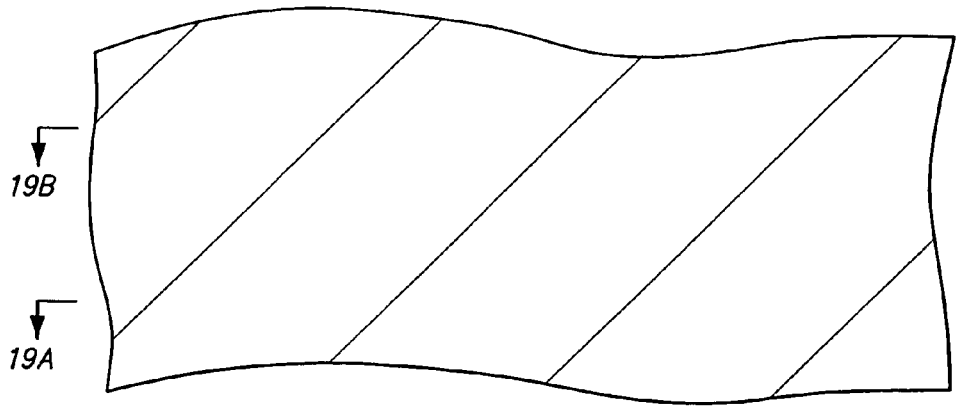
Figure 19D:
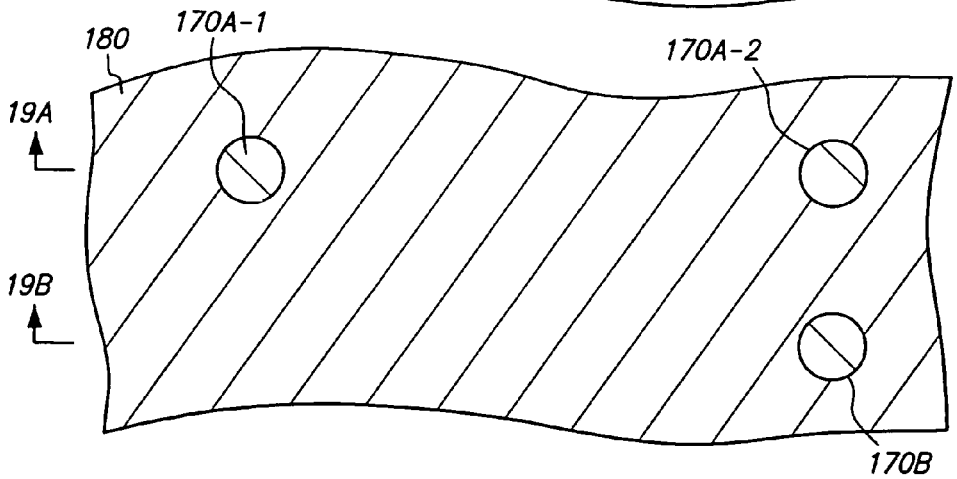
Figure 20A:
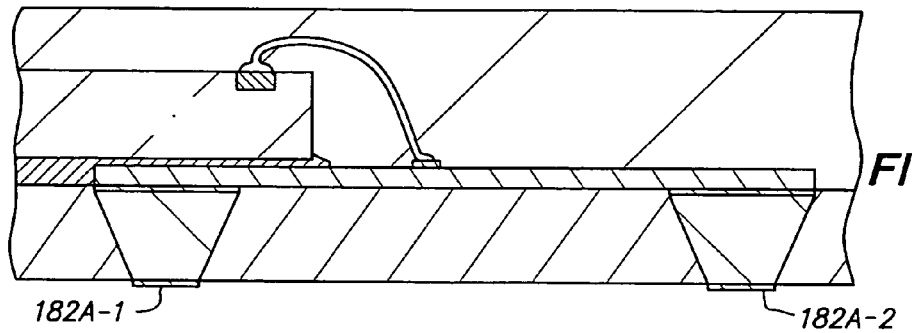
Figure 20B:
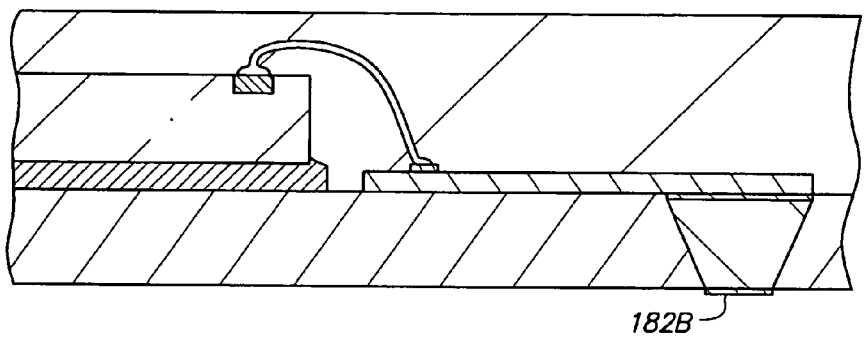
Figure 20C:
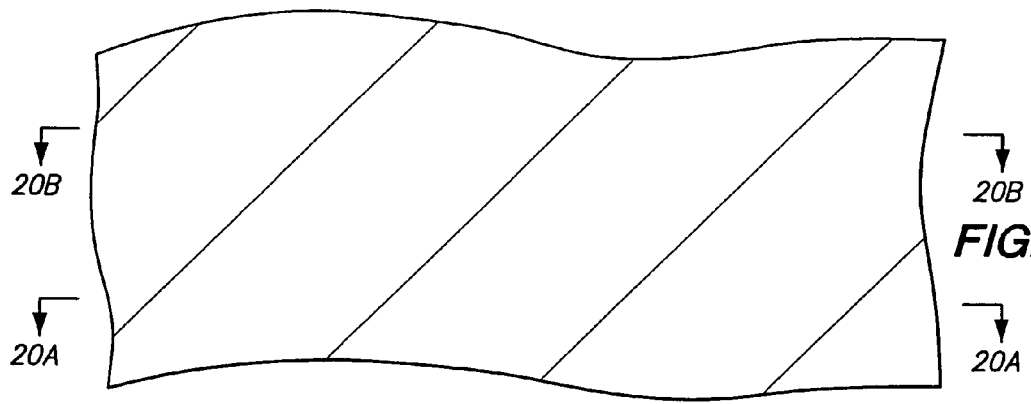
Figure 20D:
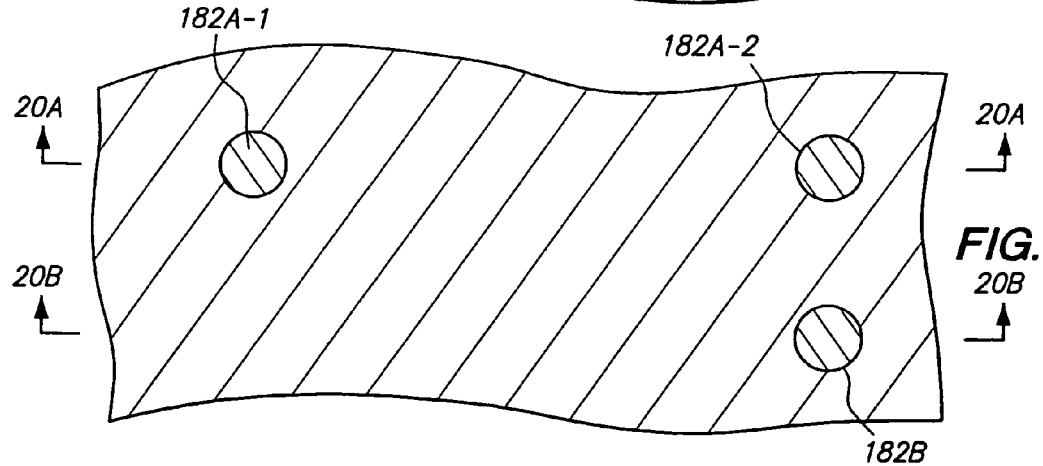
Figure 21A:
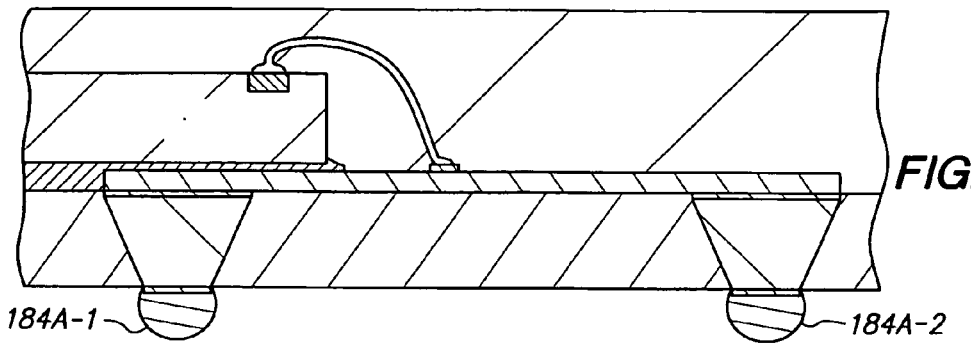
Figure 21B:
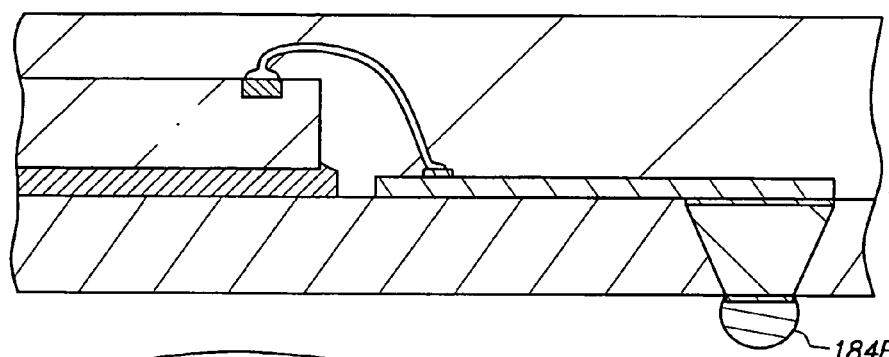
Figure 21C:
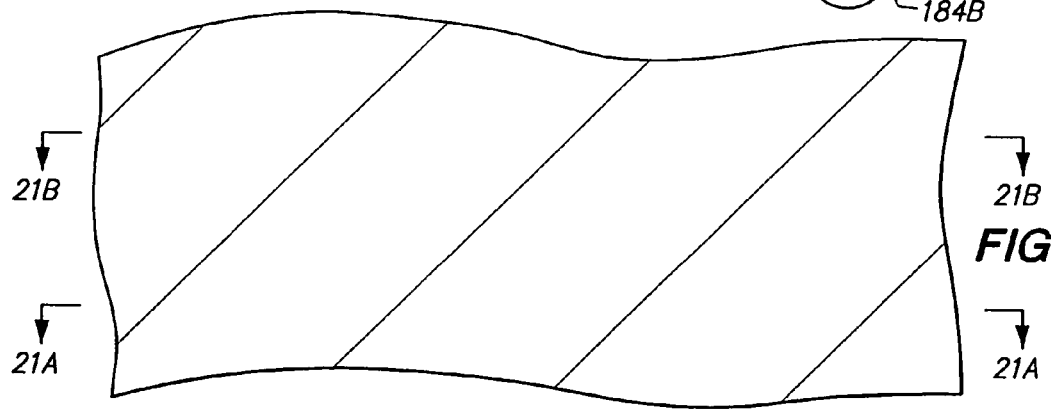
Figure 21D:
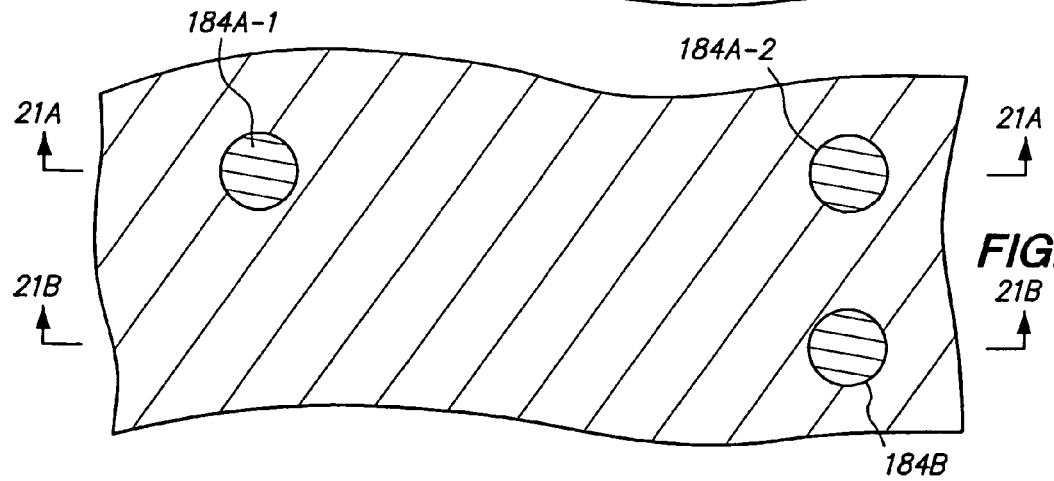
Figure 22A:
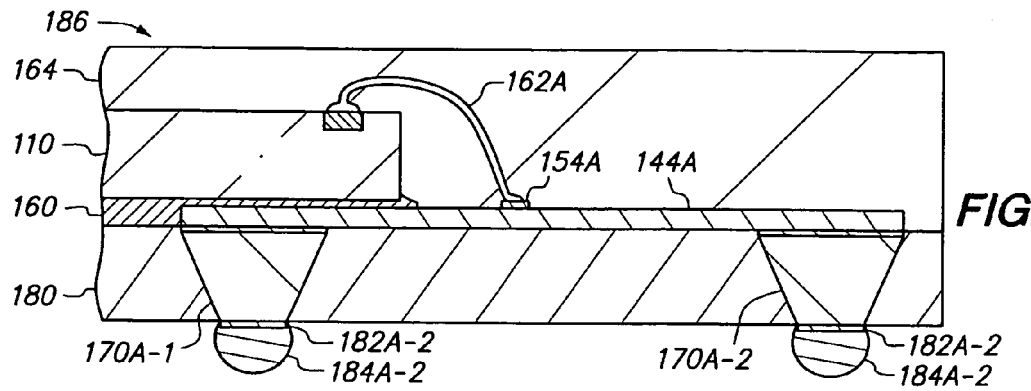
Figure 22B:
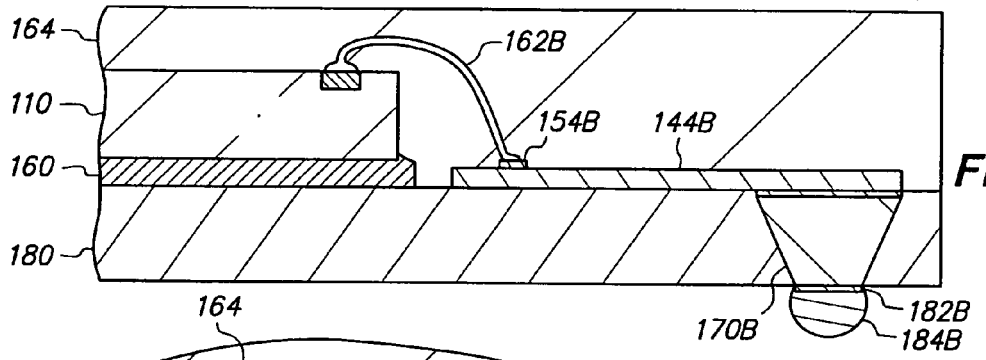
Figure 22C:
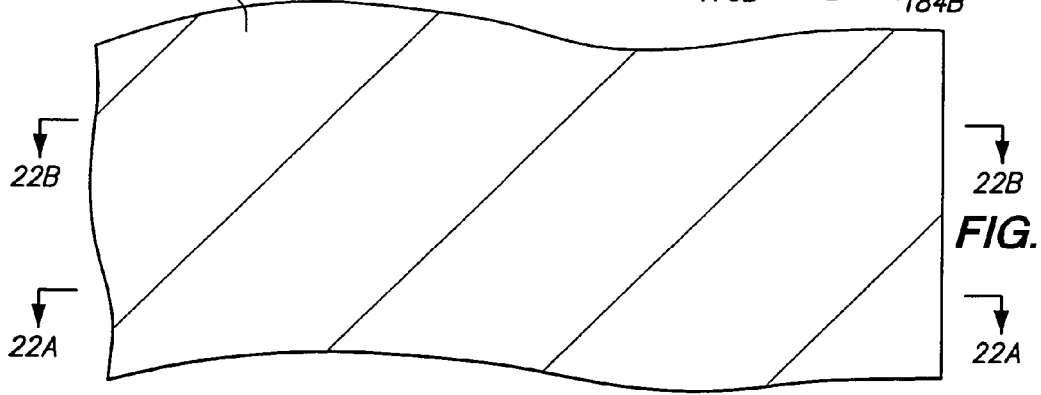
Figure 22D:
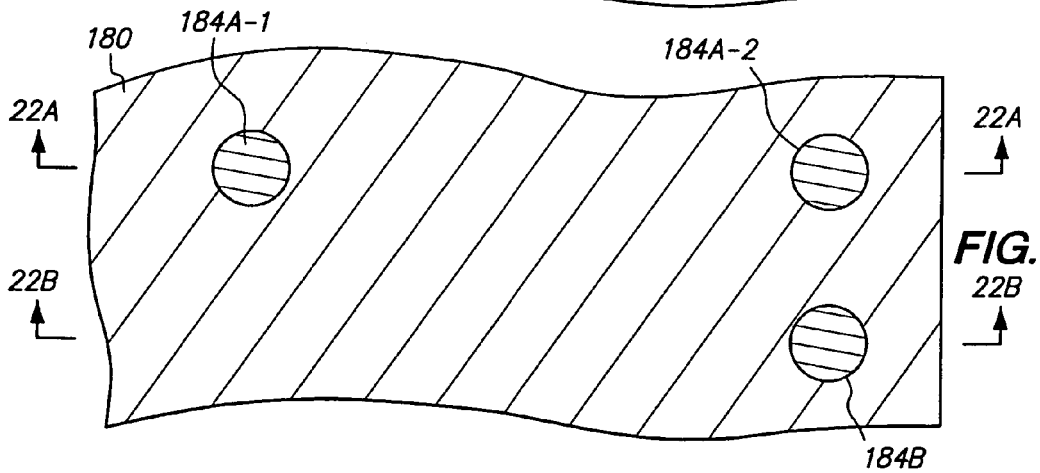

FIGS. 1A, 1B, IC and 1D are cross-sectional, cross-sectional, top and bottom views, respectively, of semiconductor chip 110 which is an integrated circuit in which various transistors, circuits, interconnect lines and the like are formed (not shown). Chip 110 includes opposing major surfaces 112 and 114 and has a thickness (between surfaces 112 and 114) of 150 microns. Surface 112 is the active surface and includes conductive pads 116A and 116B and passivation layer 118. Pads 116A and 116B provide bonding sites to electrically couple chip 110 with external circuitry.

Pads 116A and 116B are substantially aligned with passivation layer 118 so that surface 112 is essentially flat. Alternatively, pads 116A and 116B can extend above or be recessed below passivation layer 118. Pads 116A and 116B have a length and width of 100 microns.

Pads 116A and 116B have an aluminum base that is cleaned by dipping chip 110 in a solution containing 0.05 M phosphoric acid at room temperature for 1 minute and then rinsed in distilled water. Pads 116A and 116B can have the aluminum base serve as a surface layer, or alternatively, pads 116A and 116B can be treated to include a surface layer that covers the aluminum base, depending on the nature of a connection joint that shall subsequently contact the surface layer. In this embodiment, the connection joint is a gold wire bond. Therefore, pads 116A and 116B need not be treated to accommodate this connection joint. Alternatively, pads 116A and 116B can be treated by depositing several metal layers, such as chromium/copper/gold or titanium/nickel/gold on the aluminum base. The chromium or titanium layer provides a barrier for the aluminum base and an adhesive between the overlaying metal and the aluminum base. The metal layers, however, are typically selectively deposited by evaporation, electroplating or sputtering using a mask which is a relatively complicated process.

Chip 110 includes many other pads on surface 112, and only pads 116A and 116B are shown for convenience of illustration. In addition, chip 110 has already been singulated from other chips that it was previously attached to on a wafer.

FIGS. 2A, 2B, 2C and 2D are cross-sectional, cross-sectional, top and bottom views, respectively, of metal plate 120 which includes opposing major surfaces 122 and 124. Metal plate 120 is a copper plate with a thickness of 150 microns.

FIGS. 3A, 3B, 3C and 3D are cross-sectional, cross-sectional, top and bottom views, respectively, of photoresist layer 126 formed on metal plate 120. Photoresist layer 126 is deposited using a dry film lamination process in which a hot roll presses photoresist layer 126 onto surface 124. A reticle (not shown) is positioned proximate to photoresist layer 126. Thereafter, photoresist layer 126 is patterned by selectively applying light through the reticle, applying a developer solution to remove the photoresist portions rendered soluble by the light, and then hard baking, as is conventional. As a result, photoresist layer 126 contains openings that selectively expose surface 124 of metal plate 120. In addition, surface 122 of metal plate 120 remains fully exposed. Photoresist layer 126 has a thickness of 25 microns.

FIGS. 4A, 4B, 4C and 4D are cross-sectional, cross-sectional, top and bottom views, respectively, of metal layer 128 and etch masks 136A-1, 136A-2 and 136B formed on metal plate 120.

Metal layer 128 is blanketly electroplated on surface 122, and etch masks 136A-1, 136A-2 and 136B are electroplated on the exposed portions of surface 124. Metal layer 128 and etch masks 136A-1, 136A-2 and 136B are composed of nickel and have a thickness of 2 microns.

Metal layer 128 and etch masks 136A-1, 136A-2 and 136B are simultaneously formed by an electroplating operation using photoresist layer 126 as a plating mask. Thus, metal layer 128 and etch masks 136A-1, 136A-2 and 136B are formed additively. Initially, a plating bus (not shown) is connected to metal plate 120, current is applied to the plating bus from an external power source, and metal plate 120 is submerged in an electrolytic nickel plating solution such as Technic Techni Nickel "S" at room temperature. As a result, the nickel electroplates (deposits or grows) on surface 122 and the exposed portions of surface 124. The nickel electroplating operation continues until the nickel has the desired thickness. Thereafter, the structure is removed from the electrolytic nickel plating solution and rinsed in distilled water to remove contaminants.

Metal layer 128 is a flat sheet. Etch masks 136A-1, 136A-2 and 136B have a circular shape with a diameter of 500 microns and are laterally spaced from one another.

Metal base 130 includes metal plate 120 and metal layer 128. Thus, metal base 130 has a thickness of 152 microns (150+2). Metal base 130 also includes opposing major surfaces 132 and 134. Metal layer 128 provides surface 132 and is spaced from surface 134, and metal plate 120 provides surface 134 (at surface 124) and is spaced from surface 132. Furthermore, etch masks 136A-1, 136A-2 and 136B contact surface 134.

FIGS. 5A, 5B, 5C and 5D are cross-sectional, cross-sectional, top and bottom views, respectively, of metal base 130 and etch masks 136A-1, 136A-2 and 136B after photoresist layer 126 is stripped. Photoresist layer 126 is removed using a solvent, such as a mild alkaline solution with a pH of 9, that is highly selective of photoresist with respect to copper and nickel. Therefore, no appreciable amount of metal base 130 or etch masks 136A-1, 136A-2 and 136B is removed.

FIGS. 6A, 6B, 6C and 6D are cross-sectional, cross-sectional, top and bottom views, respectively, of photoresist layers 140 and 142 formed on metal base 130 and etch masks 136A-1, 136A-2 and 136B. Photoresist layers 140 and 142 are deposited using a dry film lamination process in which hot rolls simultaneously press photoresist layers 140 and 142 onto surfaces 132 and 134, respectively. Thereafter, photoresist layer 140 is patterned by selectively applying light through a reticle (not shown), applying a developer solution to remove the photoresist portions rendered soluble by the light, and then hard baking, as is conventional. As a result, photoresist layer 140 contains openings that selectively expose surface 132 of metal base 130, and photoresist layer 142 remains unpatterned. In addition, photoresist layer 142 covers surface 134 of metal base 130 and etch masks 136A-1, 136A-2 and 136B. Photoresist layers 140 and 142 have a thickness of 25 microns.

FIGS. 7A, 7B, 7C and 7D are cross-sectional, cross-sectional, top and bottom views, respectively, of routing lines 144A and 144B formed on metal base 130.

Routing lines 144A and 144B are electroplated on the exposed portions of surface 132. Routing lines 144A and 144B are composed of copper and have a thickness of 20 microns.

Routing lines 144A and 144B are simultaneously formed by an electroplating operation using photoresist layers 140 and 142 as plating masks. Thus, routing lines 144A and 144B are formed additively. Initially, a plating bus (not shown) is connected to metal base 130, current is applied to the plating bus from an external power source, and metal base 130 is submerged in an electrolytic copper plating solution such as Sel-Rex CUBATH M™ at room temperature. As a result, the copper electroplates on the exposed portions of surface 132. The copper electroplating operation continues until the copper has the desired thickness. Thereafter, the structure is removed from the electrolytic copper plating solution and rinsed in distilled water to remove contaminants.

Routing line 144A is a flat planar lead that includes elongated region 146A with a width (orthogonal to its elongated length) of 100 microns and enlarged circular regions 148A-1 and 148A-2 with a diameter of 500 microns, and routing line 144B is a flat planar leads that includes elongated region 146B with a width (orthogonal to its elongated length) of 100 microns and enlarged circular region 148B with a diameter of 500 microns. Furthermore, etch mask 136A-1 and enlarged circular region 148A-1 are vertically aligned with one another, etch mask 136A-2 and enlarged circular region 148A-2 are vertically aligned with one another, and etch mask 136B and enlarged circular region 148B are vertically aligned with one another.

Routing lines 144A and 144B are flat planar leads that are coplanar with one another, laterally spaced from one another and have essentially identical thicknesses.

Etch masks 136A-1, 136A-2 and 136B and routing lines 144A and 144B contact metal base 130, are spaced and separated from one another, and are electrically connected to one another by metal base 130.

FIGS. 8A, 8B, 8C and 8D are cross-sectional, cross-sectional, top and bottom views, respectively, of metal base 130, etch masks 136A-1, 136A-2 and 136B and routing lines 144A and 144B after photoresist layers 140 and 142 are stripped. Photoresist layers 140 and 142 are removed using a solvent, such as a mild alkaline solution with a pH of 9, that is highly selective of photoresist with respect to copper and nickel. Therefore, no appreciable amount of metal base 130, etch masks 136A-1, 136A-2 and 136B or routing lines 144A and 144B is removed.

FIGS. 9A, 9B, 9C and 9D are cross-sectional, cross-sectional, top and bottom views, respectively, of photoresist layers 150 and 152 formed on metal base 130, etch masks 136A-1, 136A-2 and 136B and routing lines 144A and 144B. Photoresist layers 150 and 152 are deposited using a dry film lamination process in which hot rolls simultaneously press photoresist layers 150 and 152 onto surfaces 132 and 134, respectively. Thereafter, photoresist layer 150 is patterned by selectively applying light through a reticle (not shown), applying a developer solution to remove the photoresist portions rendered soluble by the light, and then hard baking, as is conventional. As a result, photoresist layer 150 contains openings that selectively expose routing lines 144A and 144B, and photoresist layer 152 remains unpatterned. In addition, photoresist layer 152 covers surface 134 of metal base 130 and etch masks 136A-1, 136A-2 and 136B. Photoresist layers 150 and 152 have a thickness of 25 microns.

FIGS. 10A, 10B, 10C and 10D are cross-sectional, cross-sectional, top and bottom views, respectively, of terminals 154A and 154B formed on routing lines 144A and 144B.

Terminals 154A and 154B are electroplated on the exposed portions of routing lines 144A and 144B, respectively. Terminals 154A and 154B are composed of nickel electroplated on routing lines 144A and 144B, and gold electroplated on the nickel. The nickel contacts and is sandwiched between routing lines 144A and 144B and the gold, and the gold contacts the nickel. Thus, the nickel is buried beneath the gold, and the gold is spaced and separated from routing lines 144A and 144B and is exposed. Terminals 154A and 154B have a thickness of 3.5 microns. In particular, the nickel has a thickness of 3 microns, and the gold has a thickness of 0.5 microns. For convenience of illustration, the nickel and gold are shown as a single layer.

Terminals 154A and 154B are simultaneously formed by an electroplating operation using photoresist layers 150 and 152 as plating masks. Thus, terminals 154A and 154B are formed additively. Initially, a plating bus (not shown) is connected to metal base 130, current is applied to the plating bus from an external power source, and metal base 130 is submerged in an electrolytic nickel plating solution such as Technic Techni Nickel "S" at room temperature. As a result, the nickel electroplates on the exposed portions of routing lines 144A and 144B. The nickel electroplating operation continues until the nickel has the desired thickness. Thereafter, the structure is removed from the electrolytic nickel plating solution and submerged in an electrolytic gold plating solution such as Technic Orotemp at room temperature while current is applied to the plating bus to electroplate the gold on the nickel. The gold electroplating operation continues until the gold has the desired thickness. Thereafter, the structure is removed from the electrolytic gold plating solution and rinsed in distilled water to remove contaminants.

Terminals 154A and 154B contact and are electrically connected to routing lines 144A and 144B, respectively.

FIGS. 11A, 11B, 11C and 11D are cross-sectional, cross-sectional, top and bottom views, respectively, of metal base 130, etch masks 136A-1, 136A-2 and 136B, routing lines 144A and 144B and terminals 154A and 154B after photoresist layers 150 and 152 are stripped. Photoresist layers 150 and 152 are removed using a solvent, such as a mild alkaline solution with a pH of 9, that is highly selective of photoresist with respect to copper, nickel and gold. Therefore, no appreciable amount of metal base 130, etch masks 136A-1, 136A-2 and 136B, routing lines 144A and 144B or terminals 154A and 154B is removed.

FIGS. 12A, 12B, 12C and 12D are cross-sectional, cross-sectional, top and bottom views, respectively, of adhesive 160 formed on metal base 130 and routing line 144A.

Adhesive 160 may include an organic surface protectant such as HK 2000 which is promptly applied to the structure after photoresist layers 150 and 152 are removed to reduce native oxide formation on the exposed copper surfaces. The use of organic surface protectant layers in insulative adhesives for semiconductor chip assemblies is well-known in the art.

Thereafter, a liquid resin (A stage) such as polyamic acid is dispensed over selected portions of metal base 130 and routing line 144A using stencil printing. During stencil printing, a stencil (not shown) is placed over metal base 130 and routing lines 144A and 144B, a stencil opening is aligned with metal base 130 and routing line 144A and offset from routing line 144B, and then a squeegee (not shown) pushes the liquid resin along the surface of the stencil opposite metal base 130 and routing lines 144A and 144B, through the stencil opening and onto metal base 130 and routing line 144A but not routing line 144B. The liquid resin is compliant enough at room temperature to conform to virtually any shape. Therefore, the liquid resin flows over and covers portions of metal base 130 and routing line 144A and remains spaced and separated from routing line 144B. Adhesive 160 has a thickness of 30 microns as measured from routing line 144A.

FIGS. 13A, 13B, 13C and 13D are cross-sectional, cross-sectional, top and bottom views, respectively, of chip 110 mechanically attached to metal base 130, etch masks 136A-1, 136A-2 and 136B, routing lines 144A and 144B and terminals 154A and 154B by adhesive 160.

Adhesive 160 extends between and contacts chip 110 and metal base 130, and likewise, adhesive 160 extends between and contacts chip 110 and routing line 144A. Surface 114 of chip 110 faces towards metal base 130 and routing line 144A and is covered by adhesive 160, and surface 112 of chip 110 faces away from metal base 130 and routing line 144A and is exposed. Chip 110 and metal base 130 do not contact one another, and chip 110 and routing line 144A do not contact one another.

Adhesive 160 is sandwiched between chip 110 and metal base 130 and between chip 110 and routing line 144A using relatively low pressure from a pick-up head that places chip 110 on adhesive 160, holds chip 110 against adhesive 160 for 5 seconds and then releases chip 110. The pick-up head is heated to a relatively low temperature such as 150° C., and adhesive 160 receives heat from the pick-up head transferred through chip 110. As a result, adhesive 160 proximate to chip 110 is partially polymerized (B stage) and forms a gel but is not fully cured, and adhesive 160 that is partially polymerized provides a loose mechanical bond between chip 110 and metal base 130 and between chip 110 and routing line 144A.

Chip 110 and metal base 130 are positioned relative to one another so that chip 110 is disposed within the periphery of adhesive 160. Chip 110 and metal base 130 can be aligned using an automated pattern recognition system.

Thereafter, the structure is placed in an oven and adhesive 160 is fully cured (C stage) and hardened at relatively low temperature in the range of 200 to 250° C. to form a solid adhesive insulative thermosetting polyimide layer that mechanically attaches chip 110 to metal base 130 and routing line 144A. Adhesive 160 is 5 microns thick between chip 110 and routing line 144A.

At this stage, routing line 144A extends within and outside the periphery of chip 110, routing line 144B and terminals 154A and 154B are disposed outside the periphery of chip 110, and metal base 130, routing lines 144A and 144B and terminals 154A and 154B are disposed vertically beyond chip 110.

FIGS. 14A, 14B, 14C and 14D are cross-sectional, cross-sectional, top and bottom views, respectively, of connection joints 162A and 162B formed on pads 116A and 116B and terminals 154A and 154B.

Connection joint 162A is a wire bond composed of gold that is ball bonded to pad 116A and then wedge bonded to terminal 154A. Likewise, connection joint 162B is a wire bond composed of gold that is ball bonded to pad 116B and then wedge bonded to terminal 154B. Thus, connection joint 162A electrically connects pad 116A and routing line 144A, and connection joint 162B electrically connects pad 116B and routing line 144B. Furthermore, connection joints 162A and 162B extend within and outside the periphery of chip 110.

At this stage, pad 116A is electrically connected to routing line 144A by terminal 154A and connection joint 162A, pad 116B is electrically connected to routing line 144B by terminal 154B and connection joint 162B, and routing lines 144A and 144B are electrically connected to one another by metal base 130. As a result, pads 116A and 116B are electrically connected to one another by metal base 130, routing lines 144A and 144B, terminals 154A and 154B and connection joints 162A and 162B.

FIGS. 15A, 15B, 15C and 15D are cross-sectional, cross-sectional, top and bottom views, respectively, of encapsulant 164 formed on chip 110, metal base 130, routing lines 144A and 144B, terminals 154A and 154B, adhesive 160 and connection joints 162A and 162B.

Encapsulant 164 is deposited by transfer molding. Transfer molding is the most popular chip encapsulation method for essentially all plastic packages. Generally speaking, transfer molding involves forming components in a closed mold from a molding compound that is conveyed under pressure in a hot, plastic state from a central reservoir called the transfer pot through a tree-like array of runners and gates into closed cavities. Molding compounds are well-known in the art.

The preferred transfer molding system includes a preheater, a mold, a press and a cure oven. The mold includes an upper mold section and a lower mold section, also called "platens" or "halves" which define the mold cavities. The mold also includes the transfer pot, runners, gates and vents. The transfer pot holds the molding compound. The runners and gates provide channels from the transfer pot to the cavities. The gates are placed near the entrances of the cavities and are constricted to control the flow and injection velocity of the molding compound into the cavities and to facilitate removal of the solidified molding compound after molding occurs. The vents allow trapped air to escape but are small enough to permit only a negligible amount of the molding compound to pass through them.

The molding compound is initially in tablet form. The preheater applies high-frequency energy to preheat the molding compound to a temperature in the range of 50 to 100° C. The preheated temperature is below the transfer temperature and therefore the preheated molding compound is not in a fluid state. In addition, the structure is placed in one of the mold cavities, and the press operates hydraulically to close the mold and seal the mold cavities by clamping together the upper and lower mold sections. Guide pins ensure proper mating of the upper and lower mold sections at the parting line. In addition, the mold is heated to a transfer temperature in the range of 150 to 250° C. by inserting electric heating cartridges in the upper and lower mold sections.

After closing the mold, the preheated molding compound in tablet form is placed in the transfer pot. Thereafter, a transfer plunger applies pressure to the molding compound in the transfer pot. The pressure is in the range of 10 to 100 kgf/cm$^2$ and preferably is set as high as possible without introducing reliability problems. The combination of heat from the mold and pressure from the transfer plunger converts the molding compound in the transfer pot into a fluid state. Furthermore, the pressure from the transfer plunger forces the fluid molding compound through the runners and the gates into the mold cavities. The pressure is maintained for a certain optimum time to ensure that the molding compound fills the cavities.

The lower mold section contacts and makes sealing engagement with and is generally flush with metal base 130. However, the upper mold section is spaced from connection joints 162A and 162B by 100 microns. As a result, the molding compound contacts the exposed portions of the chip 110, metal base 130, routing lines 144A and 144B, terminals 154A and 154B, adhesive 160 and connection joints 162A and 162B in the cavity. After 1 to 3 minutes at the transfer temperature, the molding compound polymerizes and is partially cured in the mold.

Once the partially cured molding compound is resilient and hard enough to is withstand ejection forces without significant permanent deformation, the press opens the mold, ejector pins remove the molded structure from the mold, and excess molding compound attached to the molded structure that solidified in the runners and the gates is trimmed and removed. The molded structure is then loaded into a magazine and postcured in the curing oven for 4 to 16 hours at a temperature somewhat lower than the transfer temperature but well above room temperature to completely cure the molding compound.

The molding compound is a multi-component mixture of an encapsulating resin with various additives. The principal additives include curing agents (or hardeners), accelerators, inert fillers, coupling agents, flame retardants, stress-relief agents, coloring agents and mold-release agents. The encapsulating resin provides a binder, the curing agent provides linear/cross-polymerization, the accelerator enhances the polymerization rate, the inert filler increases thermal conductivity and thermal shock resistance and reduces the thermal coefficient of expansion, resin bleed, shrinkage and residual stress, the coupling agent enhances adhesion to the structure, the flame retardant reduces flammability, the stress-relief agent reduces crack propagation, the coloring agent reduces photonic activity and device visibility, and the mold-release agent facilitates removal from the mold.

Encapsulant 164 contacts and covers chip 110, metal base 130, routing lines 144A and 144B, terminals 154A and 154B, adhesive 160 and connection joints 162A and 162B and is spaced from etch masks 136A-1, 136A-2 and 136B.

Encapsulant 164 is a solid adherent compressible protective layer that provides environmental protection such as moisture resistance and particle protection for chip 110 as well as mechanical support for routing lines 144A and 144B outside the periphery of chip 110.

Encapsulant 164 extends vertically beyond chip 110, metal base 130, etch masks 136A-1, 136A-2 and 136B, routing lines 144A and 144B, terminals 154A and 154B, adhesive 160 and connection joints 162A and 162B, and is 100 microns thick beyond connection joints 162A and 162B. Furthermore, metal base 130 is disposed vertically beyond encapsulant 164.

FIGS. 16A, 16B, 16C and 16D are cross-sectional, cross-sectional, top and bottom views, respectively, of pillars 170A-1, 170A-2 and 170B partially formed from metal base 130.

Pillars 170A-1, 170A-2 and 170B are partially formed by applying a first wet chemical etch to metal base 130 using etch masks 136A-1, 136A-2 and 136B to selectively protect metal base 130. Metal base 130 is provided by metal plate 120 and metal layer 128. Metal plate 120 is copper and metal layer 128 is nickel. Etch masks 136A-1, 136A-2 and 136B contact metal plate 120 at surface 134 and are nickel.

A first back-side wet chemical etch is applied to surface 134 of metal base 130 and etch masks 136A-1, 136A-2 and 136B. For instance, the first wet chemical etch can be sprayed on surface 134 and etch masks 136A-1, 136A-2 and 136B, or the structure can be dipped in the first wet chemical etch since encapsulant 164 provides front-side protection.

The first wet chemical etch is a copper etching solution, such as a solution containing alkaline ammonia, that is highly selective of copper with respect to nickel and the molding compound, and therefore, highly selective of metal plate 120 with respect to metal layer 128, etch masks 136A-1, 136A-2 and 136B and encapsulant 164.

The first wet chemical etch etches completely through metal plate 120 and removes most of metal plate 120, thereby effecting a pattern transfer of etch masks 136A-1, 136A-2 and 136B onto metal plate 120 and exposing metal layer 128, but not exposing routing lines 144A and 144B, adhesive 160 or encapsulant 164. However, unetched portions of metal plate 120 defined by etch masks 136A-1, 136A-2 and 136B remain intact and form portions of pillars 170A-1, 170A-2 and 170B, respectively. In addition, no appreciable amount of metal layer 128, etch masks 136A-1, 136A-2 and 136B or encapsulant 164 is removed. Furthermore, metal layer 128 protects the underlying routing lines 144A and 144B from the first wet chemical etch.

The optimal etch time for exposing the structure to the first wet chemical etch in order to etch through metal plate 120 and partially form pillars 170A-1, 170A-2 and 170B with the desired shapes and dimensions without excessively exposing the nickel features to the first wet chemical etch can be established through trial and error.

FIGS. 17A, 17B, 17C and 17D are cross-sectional, cross-sectional, top and is bottom views, respectively, of the structure after etch masks 136A-1, 136A-2 and 136B are removed and pillars 170A-1, 170A-2 and 170B are fully formed from metal base 130.

Etch masks 136A-1, 136A-2 and 136B are removed and pillars 170A-1, 170A-2 and 170B are fully formed by applying a second wet chemical etch.

A second back-side wet chemical etch is applied to metal layer 128, etch masks 136A-1, 136A-2 and 136B and pillars 170A-1, 170A-2 and 170B. For instance, the second wet chemical etch can be sprayed on metal layer 128, etch masks 136A-1, 136A-2 and 136B and pillars 170A-1, 170A-2 and 170B, or the structure can be dipped in the second wet chemical etch since encapsulant 164 provides front-side protection.

The second wet chemical etch is a nickel etching solution, such as a dilute mixture of nitric and hydrochloric acid, that is highly selective of nickel with respect to polyimide and the molding compound.

The second wet chemical etch removes etch masks 136A-1, 136A-2 and 136B, thereby exposing surfaces 174A-1, 174A-2 and 174B of pillars 170A-1, 170A-2 and 170B, respectively.

The second wet chemical etch also etches completely through metal layer 128 and removes most of metal layer 128, thereby effecting a pattern transfer of etch masks 136A-1, 136A-2 and 136B onto metal layer 128 and exposing routing lines 144A and 144B, adhesive 160 and encapsulant 164. However, unetched portions of metal layer 128 defined by etch masks 136A-1, 136A-2 and 136B remain intact and form portions of pillars 170A-1, 170A-2 and 170B, respectively. In addition, no appreciable amount of adhesive 160 or encapsulant 164 is removed. Furthermore, routing lines 144A and 144B protect the underlying terminals 154A and 154B from the second wet chemical etch.

Since metal layer 128 and etch masks 136A-1, 136A-2 and 136B are extremely thin relative to the copper of routing lines 144A and 144B and pillars 170A-1, 170A-2 and 170B, and the structure is removed from the nickel etching solution soon after the exposed portions of metal layer 128 are removed and etch masks 136A-1, 136A-2 and 136B are stripped, it is not critical that the nickel etching solution be highly selective of nickel with respect to copper. In fact, the nickel etching solution is also selective of copper. As a result, the nickel etching solution also removes a slight amount of the exposed copper features. However, the nickel etching solution is not applied long enough to appreciably affect the exposed copper features. Therefore, the nickel etching solution has no appreciable affect on routing lines 144A and 144B or pillars 170A-1, 170A-2 and 170B.

The second wet chemical etch may slightly undercut the nickel portion of pillars 170A-1 and 170A-2 and 170B relative to the copper portion of pillars 170A-1 and 170A-2 and 170B. For convenience of explanation, this slight undercut is ignored.

The optimal etch time for exposing the structure to the second wet chemical etch in order to etch through metal layer 128, remove etch masks 136A-1, 136A-2 and 136B and form pillars 170A-1, 170A-2 and 170B with the desired shapes and dimensions without excessively exposing the copper features to the second wet chemical etch can be established through trial and error.

Pillars 170A-1, 170A-2 and 170B are formed by applying a wet chemical etch to metal base 130 using etch masks 136A-1, 136A-2 and 136B to selectively protect metal base 130. Pillars 170A-1, 170A-2 and 170B are unetched portions of metal base 130 defined by etch masks 136A-1, 136A-2 and 136B, respectively, that contact routing lines 144A, 144A and 144B, respectively, and are formed subtractively.

The wet chemical etch is provided by sequentially applying the first and second wet chemical etches using the copper and nickel etching solutions. The wet chemical etch etches completely through metal base 130 and removes most of metal base 130, thereby effecting a pattern transfer of etch masks 136A-1, 136A-2 and 136B onto metal base 130, exposing routing lines 144A and 144B, adhesive 160 and encapsulant 164, and reducing but not eliminating contact area between metal base 130 and routing lines 144A and 144B.

The wet chemical etch laterally undercuts metal base 130 relative to etch masks 136A-1, 136A-2 and 136B, causing pillars 170A-1 and 170A-2 to taper inwardly as they extend vertically from routing line 144A and causing pillar 170B to taper inwardly as it extends vertically from routing line 144B. A suitable taper is between 45 and slightly less than 90 degrees, such as approximately 75 degrees.

The wet chemical etch also electrically isolates routing lines 144A and 144B from one another, and consequently electrically isolates terminals 154A and 154B from one another, connection joints 162A and 162B from one another and pads 116A and 116B from one another. That is, since pillars 170A-1 and 170A-2 are the only unetched portions of metal base 130 that contact routing line 144A after the etch occurs, and pillar 170B is the only unetched portion of metal base 130 that contacts routing line 144B after the etch occurs, and pillars 170A-1, 170A-2 and 170B are spaced and separated from one another, metal base 130 no longer electrically connects routing lines 144A and 144B.

Encapsulant 164 provides mechanical support for routing lines 144A and 144B and pillars 170A-1, 170A-2 and 170B and reduces mechanical strain on adhesive 160. Encapsulant 164 protects routing lines 144A and 144B and pillars 170A-1, 170A-2 and 170B from mechanical damage by the wet chemical etch and subsequent cleaning steps (such as rinsing in distilled water and air blowing). For instance, encapsulant 164 absorbs physical force of the wet chemical etch and cleaning steps that might otherwise separate routing line 144A from pillars 170A-1 and 170A-2 and separate routing line 144B from pillar 170B. Thus, encapsulant 164 improves structural integrity and allows the wet chemical etch and subsequent cleaning steps to be applied more vigorously, thereby improving manufacturing throughput.

Pillar 170A-1 includes opposing surfaces 172A-1 and 174A-1 and tapered sidewalls 176A-1 therebetween, pillar 170A-2 includes opposing surfaces 172A-2 and 174A-2 and tapered sidewalls 176A-2 therebetween, and pillar 170B includes opposing surfaces 172B and 174B and tapered sidewalls 176B therebetween. Surfaces 172A-1, 172A-2 and 172B of pillars 170A-1, 170A-2 and 170B constitute unetched portions of surface 132 of metal base 130 provided by metal layer 128, and surfaces 174A-1, 174A-2 and 174B of pillars 170A-1, 170A-2 and 170B constitute unetched portions of surface 134 of metal base 130 provided by metal plate 120.

Surfaces 172A-1 and 172A-2 contact and face towards routing line 144A, and surface 172B contacts and faces towards routing line 144B. Surfaces 174A-1 and 174A-2 are spaced from and face away from routing line 144A and are exposed, and surface 174B is spaced from and faces away from routing line 144B and is exposed. Furthermore, surfaces 174A-1 and 174A-2 contacted and faced towards and were covered by etch masks 136A-1 and 136A-2, respectively, before etch masks 136A-1 and 136A-2 were removed, and surface 174B contacted and faced towards and was covered by etch mask 136B before etch mask 136B was removed. Surfaces 172A-1, 172A-2, 172B, 174A-1, 174A-2 and 174B are flat and parallel to one another. Tapered sidewalls 176A-1 are adjacent to surfaces 172A-1 and 174A-1 and slant inwardly towards surface 174A-1, tapered sidewalls 176A-2 are adjacent to surfaces 172A-2 and 174A-2 and slant inwardly towards surface 174A-2, and tapered sidewalls 176B are adjacent to surfaces 172B and 174B and slant inwardly towards surface 174B.

Pillar 170A-1 has a conical shape with a height (between surfaces 172A-1 and 174A-1) of 152 microns and a diameter that decreases as the height increases (towards surface 174A-1 and away from surface 172A-1). Surface 172A-1 has a circular shape with a diameter of 500 microns, and surface 174A-1 has a circular shape with a diameter of 350 microns. Surfaces 172A-1 and 174A-1 are vertically aligned with enlarged circular region 148A-1 and one another. Thus, surface 174A-1 is concentrically disposed within the surface areas of enlarged circular region 148A-1 and surface 172A-1, and the periphery of surface 174A-1 is laterally offset from the peripheries of enlarged circular region 148A-1 and surface 172A-1.

Pillar 170A-2 has a conical shape with a height (between surfaces 172A-2 and 174A-2) of 152 microns and a diameter that decreases as the height increases (towards surface 174A-2 and away from surface 172A-2). Surface 172A-2 has a circular shape with a diameter of 500 microns, and surface 174A-2 has a circular shape with a diameter of 350 microns. Surfaces 172A-2 and 174A-2 are vertically aligned with enlarged circular region 148A-2 and one another. Thus, surface 174A-2 is concentrically disposed within the surface areas of enlarged circular region 148A-2 and surface 172A-2, and the periphery of surface 174A-2 is laterally offset from the peripheries of enlarged circular region 148A-2 and surface 172A-2.

Pillar 170B has a conical shape with a height (between surfaces 172B and 174B) of 152 microns and a diameter that decreases as the height increases (towards surface 174B and away from surface 172B). Surface 172B has a circular shape with a is diameter of 500 microns, and surface 174B has a circular shape with a diameter of 350 microns. Surfaces 172B and 174B are vertically aligned with enlarged circular region 148B and one another. Thus, surface 174B is concentrically disposed within the surface areas of enlarged circular region 148B and surface 172B, and the periphery of surface 174B is laterally offset from the peripheries of enlarged circular region 148B and surface 172B.

Routing line 144A and pillar 170A-1 contact one another, adhere to one another, are metallurgically bonded to one another, are electrically connected to one another and are non-integral with one another. In addition, routing line 144A and pillar 170A-1 are adjacent to one another, routing line 144A extends laterally from pillar 170A-1, and pillar 170A-1 extends vertically from routing line 144A.

Routing line 144A and pillar 170A-2 contact one another, adhere to one another, are metallurgically bonded to one another, are electrically connected to one another and are non-integral with one another. In addition, routing line 144A and pillar 170A-2 are adjacent to one another, routing line 144A extends laterally from pillar 170A-2, and pillar 170A-2 extends vertically from routing line 144A.

Routing line 144B and pillar 170B contact one another, adhere to one another, are metallurgically bonded to one another, are electrically connected to one another and are non-integral with one another. In addition, routing line 144B and pillar 170B are adjacent to one another, routing line 144B extends laterally from pillar 170B, and pillar 170B extends vertically from routing line 144B.

Pillars 170A-1, 170A-2 and 170B are coplanar with one another, laterally spaced from one another and have essentially identical thicknesses. Furthermore, pillars 170A-1, 170A-2 and 170B are disposed vertically beyond chip 110, adhesive 160, connection joints 162A and 162B and encapsulant 164, and pillar 170A-1 is disposed within the periphery of chip 110, however pillars 170A-2 and 170B are disposed outside the periphery of chip 110.

Conductive trace 178A includes routing line 144A, terminal 154A and pillars 170A-1 and 170A-2 and is electrically connected to pad 116A by connection joint 162A, and conductive trace 178B includes routing line 144B, terminal 154B and pillar 170B and is electrically connected to pad 116B by connection joint 162B. Conductive trace 178A is adapted for providing horizontal and vertical routing between pad 116A and a next level assembly, and conductive trace 178B is adapted for providing horizontal and vertical routing between pad 116B and a next level assembly.

At this stage, routing lines 144A and 144B, adhesive 160, encapsulant 164 and pillars 170A-1, 170A-2 and 170B are exposed, and encapsulant 164 provides mechanical support for adhesive 160 and conductive traces 178A and 178B that is particularly useful after most of metal base 130 is removed by the etch.

FIGS. 18A, 18B, 18C and 18D are cross-sectional, cross-sectional, top and bottom views, respectively, of insulative base 180 formed on routing lines 144A and 144B, adhesive 160, encapsulant 164 and pillars 170A-1, 170A-2 and 170B.

Insulative base 180 may include an organic surface protectant such as HK 2000 which is promptly applied to the structure after etch masks 136A-1, 136A-2 and 136B are removed and pillars 170A-1, 170A-2 and 170B are formed to reduce native oxide formation on the exposed copper surfaces. The use of organic surface protectant layers in insulative bases for semiconductor chip assemblies is well-known in the art.

Thereafter, a liquid resin (A stage) such as Hysol 308 is dispensed over routing lines 144A and 144B, adhesive 160, encapsulant 164 and pillars 170A-1, 170A-2 and 170B. The liquid resin is compliant enough at room temperature to conform to virtually any shape. Therefore, the liquid resin flows over and covers routing lines 144A and 144B, adhesive 160, encapsulant 164 and pillars 170A-1, 170A-2 and 170B.

Thereafter, the structure is placed in an oven and insulative base 180 is fully cured (C stage) and hardened at relatively low temperature in the range of 200 to 250° C. to form a solid adhesive insulative thermosetting polyimide layer that protects routing lines 144A and 144B and enhances the mechanically attachment of pillars 170A-1, 170A-2 and 170B.

Insulative base 180 contacts and covers and extends vertically beyond routing lines 144A and 144B, adhesive 160, encapsulant 164 and pillars 170A-1, 170A-2 and 170B.

For convenience of illustration, insulative base 180 is shown below chip 110, routing lines 144A and 144B, terminals 154A and 154B, adhesive 160, connection joints 162A and 162B, encapsulant 164 and pillars 170A-1, 170A-2 and 170B to retain a single orientation throughout the figures for ease of comparison between the figures, although in this step the structure would be inverted to assist the liquid resin flow and the curing process.

FIGS. 19A, 19B, 19C and 19D are cross-sectional, cross-sectional, top and bottom views, respectively, of the structure after a lower portion of insulative base 180 is removed to expose pillars 170A-1, 170A-2 and 170B.

The lower portion of insulative base 180 is removed by grinding. In particular, a rotating diamond sand wheel and distilled water are applied to the back-side of the structure. Initially, the diamond sand wheel grinds only insulative base 180. As the grinding continues, insulative base 180 becomes thinner as the grinded surface migrates vertically towards chip 110. Eventually the diamond sand wheel contacts pillars 170A-1, 170A-2 and 170B, and as a result, begins to grind pillars 170A-1, 170A-2 and 170B as well. As the grinding continues, pillars 170A-1, 170A-2 and 170B and insulative base 180 become thinner as the grinded surfaces migrate vertically towards chip 110. However, the grinding halts soon after it reaches pillars 170A-1, 170A-2 and 170B, and well before it reaches chip 110, routing lines 144A and 144B, terminals 154A and 154B, adhesive 160, connection joints 162A and 162B or encapsulant 164. As a result, no appreciable amount of pillars 170A-1, 170A-2 or 170B is removed. Thereafter, the structure is rinsed in distilled water to remove contaminants.

At this stage, pillars 170A-1, 170A-2 and 170B and insulative base 180 are laterally aligned with one another and exposed.

FIGS. 20A, 20B, 20C and 20D are cross-sectional, cross-sectional, top and bottom views, respectively, of metal coating 182A-1 formed on pillar 170A-1, metal coating 182A-2 formed on pillar 170A-2 and metal coating 182B formed on pillar 170B.

Initially, the structure is dipped in an activator solution such as dilute palladium chloride of approximately 0.1 grams of palladium chloride and 5 cubic centimeters of hydrochloric acid per liter of water to render pillars 170A-1, 170A-2 and 170B catalytic to electroless nickel, then the structure is rinsed in distilled water to remove the palladium from encapsulant 164 and insulative base 180.

Thereafter, the structure is submerged in an electroless nickel plating solution such as Enthone Enplate NI-424 at 85° C. Preferred nickel plating solutions include nickel-sulfate and nickel-chloride and have a pH of about 9.5 to 10.5. A higher nickel concentration provides a faster plating rate but reduces the stability of the solution. The amount of chelating agents or ligands in the solution depends on the nickel concentration and their chemical structure, functionality and equivalent weight. Most of the chelating agents used in electroless nickel plating solutions are hydroxy organic acids which form one or more water soluble nickel ring complexes. These complexes reduce the free nickel ion concentration, thereby increasing the stability of the solution while retaining a reasonably fast plating rate. Generally, the higher the complex agent concentration, the slower the plating rate. In addition, the pH of the solution and the plating rate continually decrease as the electroless plating continues due to hydrogen ions being introduced into the solution as a byproduct of the nickel reduction. Accordingly, the solution is buffered to offset the effects of the hydrogen ions. Suitable buffering agents include sodium or potassium salts of mono and dibasic organic acids. Finally, those skilled in the art will understand that electroless nickel plating solutions do not deposit pure elemental nickel since a reducing agent such as $H_2PO_2$ will naturally decompose into the electrolessly plated nickel. Therefore, those skilled in the art will understand that electrolessly plated nickel refers to a nickel compound that is mostly nickel but not pure elemental nickel.

The exposed copper features include palladium and therefore are catalytic to electroless nickel. Furthermore, encapsulant 164 and insulative base 180 are not catalytic to electroless nickel and therefore a plating mask is not necessary. As a result, the nickel deposits on the palladium-bearing copper surfaces. The nickel electroless plating operation continues until the nickel surface layers are about 4 microns thick. Thereafter, the structure is removed from the electroless nickel plating solution and rinsed in distilled water.

Thereafter, the assembly is removed from the electroless nickel plating solution and briefly submerged in an electroless gold plating solution such as is MacDermid PLANAR™ at 70° C. The exposed nickel surface layers are catalytic to electroless gold. Furthermore, encapsulant 164 and insulative base 180 are not catalytic to electroless gold and therefore a plating mask is not necessary. As a result, the gold deposits on the nickel surface layers. The gold electroless plating operation continues until the gold surface layers are about 0.5 microns thick. Thereafter, the structure is removed from the electroless gold plating solution and rinsed in distilled water.

In this manner, metal coatings 182A-1, 182A-2 and 182B are simultaneously formed during a single electroless plating operation. Metal coating 182A-1 contacts and is electrically connected to and is disposed vertically beyond pillar 170A-1, metal coating 182A-2 contacts and is electrically connected to and is disposed vertically beyond pillar 170A-2, and metal coating 182B contacts and is electrically connected to and is disposed vertically beyond pillar 170B.

Metal coatings 182A-1, 182A-2 and 182B are composed of a buried nickel layer that is 4 microns thick and a gold surface layer that is 0.5 microns thick. In metal coating 182A-1, the buried nickel layer provides the primary mechanical and electrical connection to pillar 170A-1, and the gold surface layer provides a wettable surface to facilitate solder reflow. In metal coating 182A-2, the buried nickel layer provides the primary mechanical and electrical connection to pillar 170A-2, and the gold surface layer provides a wettable surface to facilitate solder reflow. In metal coating 182B, the buried nickel layer provides the primary mechanical and electrical connection to pillar 170B, and the gold surface layer provides a wettable surface to facilitate solder reflow. For convenience of illustration, the nickel and gold layers are shown as a single layer.

FIGS. 21A, 21B, 21C and 21D are cross-sectional, cross-sectional, top and bottom views, respectively, of solder balls 184A-1, 184A-2 and 184B formed on metal coatings 182A-1, 182A-2 and 182B.

Solder balls 184A-1, 184A-2 and 184B are initially tin-lead balls with spherical shapes. The tin-lead balls are dipped in flux to provide solder balls 184A-1, 184A-2 and 184B with flux surface coatings that surround the tin-lead balls. Thereafter, the structure is inverted so that metal coatings 182A-1, 182A-2 and 182B face upwardly, and solder balls 184A-1, 184A-2 and 184B are deposited on metal coatings 182A-1, 182A-2 and 182B, respectively. Solder balls 184A-1, 184A-2 and 184B weakly adhere to metal coatings 182A-1, 182A-2 and 182B due to the flux surface coatings of solder balls 184A-1, 184A-2 and 184B.

Thereafter, heat is applied to reflow solder balls 184A-1, 184A-2 and 184B. Metal coatings 182A-1, 182A-2 and 182B contain gold surface layers that provide wettable surfaces for solder reflow. As a result, solder balls 184A-1, 184A-2 and 184B wet metal coatings 182A-1, 182A-2 and 182B, respectively. The heat is then removed and solder balls 184A-1, 184A-2 and 184B cool and solidify.

Solder ball 184A-1 contacts and is electrically connected to metal coating 182A-1 and extends downwardly beyond metal coating 182A-1. Thus, solder ball 184A-1 provides a reflowable electrical connection to metal coating 182A-1 that protrudes downwardly from metal coating 182A-1 and is exposed.

Solder ball 184A-2 contacts and is electrically connected to metal coating 182A-2 and extends downwardly beyond metal coating 182A-2. Thus, solder ball 184A-2 provides a reflowable electrical connection to metal coating 182A-2 that protrudes downwardly from metal coating 182A-2 and is exposed.

Solder ball 184B contacts and is electrically connected to metal coating 182B and extends downwardly beyond metal coating 182B. Thus, solder ball 184B provides a reflowable electrical connection to metal coating 182B that protrudes downwardly from metal coating 182B and is exposed.

Solder balls 184A-1, 184A-2 and 184B are coplanar with one another, laterally spaced from one another and have essentially identical thicknesses.

At this stage, conductive trace 178A includes routing line 144A, terminal 154A, pillars 170A-1 and 170A-2, metal coatings 182A-1 and 182A-2 and solder balls 184A-1 and 184A-2, and conductive trace 178B includes routing line 144B, terminal 154B, pillar 170B, metal coating 182B and solder ball 184B.

FIGS. 22A, 22B, 22C and 22D are cross-sectional, cross-sectional, top and bottom views, respectively, of the structure after encapsulant 164 and insulative base 180 are cut with an excise blade to singulate the assembly from other assemblies.

At this stage, the manufacture of semiconductor chip assembly 186 that includes chip 110, routing lines 144A and 144B, terminals 154A and 154B, adhesive 160, connection joints 162A and 162B, encapsulant 164, pillars 170A-1, 170A-2 and 170B, insulative base 180, metal coatings 182A-1, 182A-2 and 182B and solder balls 184A-1, 184A-2 and 184B can be considered complete.

The semiconductor assembly is a first-level package in which pillars 170A-1, 170A-2 and 170B are formed using multiple etch steps.

The semiconductor chip assembly includes other conductive traces embedded in encapsulant 164 and insulative base 180, and only two conductive traces 178A and 178B are shown for convenience of illustration. The other conductive traces each include a respective pillar, routing line, terminal, metal coating and solder ball. The other conductive traces are each electrically connected to a respective pad on chip 110 by a respective connection joint. The other conductive traces each extend beyond an outer edge of chip 110 and provide horizontal fan-out routing and vertical routing for their respective pads. Furthermore, the other conductive traces each include a downwardly protruding solder ball so that the assembly provides a ball grid array (BGA) package.

Chip 110 is designed with the pads electrically isolated from one another. However, the corresponding routing lines are initially electroplated on metal base 130 and electrically connected to one another by metal base 130. Thereafter, once metal base 130 is etched to form the pillars, the routing lines are electrically isolated from one another by adhesive 160, encapsulant 164 and subsequently insulative base 180. Therefore, the pads remain electrically isolated from one another.

Advantageously, there is no plating bus or related circuitry that need be disconnected or severed from the conductive traces after the pillars are formed.

The semiconductor chip assembly described above is merely exemplary. Numerous other embodiments are contemplated. For instance, the insulative base, the metal coatings and/or the solder balls can be omitted. The embodiment described above can be mixed-and-matched with other embodiments depending on design and reliability considerations.

The metal plate and the metal layer can be various metals such as copper, copper alloys, nickel, iron-nickel alloys, aluminum, and so on, and can be a single layer or multiple layers.

The metal base need not necessarily be dedicated solely to pillar formation. For instance, portions of the metal base can be selectively etched to form the pillars, and another portion of the metal base that is disposed within the periphery of the chip and spaced from the pillars can remain intact and provide a heat sink.

The routing line can be various conductive metals including copper, gold, nickel, silver, palladium, tin, combinations thereof, and alloys thereof. The preferred composition of the routing line will depend on the nature of the metals it contacts as well as design and reliability factors. Furthermore, those skilled in the art will understand that in the context of a semiconductor chip assembly, a copper material is typically a copper alloy that is mostly copper but not pure elemental copper, such copper-zirconium (99.9% copper), copper-silver-phosphorus-magnesium (99.7% copper), or copper-tin-iron-phosphorus (99.7% copper). Likewise, the routing line can fan-in or fan-out or both.

The routing line can be formed on the metal base by numerous deposition techniques including electroplating and electroless plating. In addition, the routing line can be deposited on the metal base as a single layer or multiple layers. For instance, the routing line can consist of a copper layer electroplated on the metal base and a non-copper layer electroplated on the copper layer. Suitable non-copper layers include nickel, gold, palladium and silver. Furthermore, it is understood that in the context of the present invention, the routing line and the metal base are different metals (or metallic materials) even if a single-layer routing line is similar to a single layer of a multi-layer metal base a multi-layer routing line includes a single layer that is similar to a single layer of a multi-layer metal base.

The routing line can be spot plated near the pad to make it compatible with receiving the connection joint. For instance, a copper routing line can be spot plated with nickel and then silver to make it compatible with a gold ball bond connection joint and avoid the formation of brittle silver-copper intermetallic compounds.

The etch mask can be a wide variety of materials including copper, gold, nickel, palladium, tin, solder, photoresist and epoxy, can be formed by a wide variety of processes including electroplating, electroless plating, printing, reflowing and curing, and can have a wide variety of shapes and sizes. The etch mask can be deposited on the metal base before, during or after the routing line is deposited on the metal base, can be disposed on a planar top surface of the metal base or a recess in the metal base, and if disposed in a recess need not necessarily fill the recess.

The pillar can be formed in numerous manners. For instance, the metal base can be etched to form a recess and expose what shall become the tip of the pillar, then the etch mask can be deposited in the recess, then the metal base can be attached to the chip, and then the metal base can be etched to undercut the metal base beneath the etch mask for the first time and form the pillar. Alternatively, the metal base can be etched to form a recess and expose what shall become the tip of the pillar, then the etch mask can be deposited in the recess, then the metal base can be etched to undercut the metal base beneath the etch mask for the first time, then the metal base can be attached to the chip, and then the metal base can be etched again to undercut the metal base beneath the etch mask for the second time and form the pillar. Preferably, etching the metal base forms the pillar from an unetched portion of the metal base also electrically isolates the pillar from other pillars. In either case, etching the metal base to form the pillar does not preclude etching and undercutting the metal base beneath the etch mask at an earlier stage (such as the example described above). Furthermore, etching the metal base to form the pillar can include an overetch such as 20 to 30% in order to assure that the pillar is electrically isolated from other pillars and compensate for non-uniformities and manufacturing tolerances.

The pillar can be formed before or after mechanically attaching the chip to the routing line, before or after forming the connection joint, and before or after forming the encapsulant. Further details regarding a pillar that is subtractively formed before mechanically attaching the chip to the routing line, forming the connection joint or forming the encapsulant are disclosed in U.S. application Ser. No. 10/714,794 filed Nov. 17, 2003 by Chuen Rong Leu et al. entitled "Semiconductor Chip Assembly with Embedded Metal Pillar" which is incorporated by reference.

The pad can have numerous shapes including a flat rectangular shape and a bumped shape. If desired, the pad can be treated to accommodate the connection joint.

Numerous adhesives can be applied to mechanically attach the chip to the routing line. For instance, the adhesive can be applied as a paste, a laminated layer, or a liquid applied by screen-printing, spin-on, or spray-on. The adhesive can be a single layer that is applied to a base and then contacted to the chip or a single layer that is applied to the chip and then contacted to a base. Similarly, the adhesive can be multiple layers with a first layer applied to a base, a second layer applied to the chip and then the layers contacted to one another. Thermosetting adhesive liquids and pastes such as epoxies are generally suitable. Likewise, thermoplastic adhesives such as an insulative thermoplastic polyimide film with a glass transition temperature (Tg) of 400° C. are also generally suitable. Silicone adhesives are also generally suitable.

The adhesive can be conductive or non-conductive. Non-conductive adhesives are preferred for low cost, high bonding strength applications, whereas thermally conductive adhesives are preferred when high thermal dissipation and a matched thermal coefficient of expansion are important, and electrically conductive adhesives are preferred when the chip needs to be grounded. Conductive adhesives can initially be an epoxy paste that includes an epoxy resin, a curing agent, an accelerator and a filler, that is subsequently cured or hardened to form a solid adherent layer. For thermally conductive adhesives, the filler can be an inert material such as silica (powdered fused quartz) that improves thermal conductivity, thermal shock resistance and thermal coefficient of expansion matching. For electrically conductive adhesives, the filler can be a metallic material such as silver particles that contact one another to provide an electrically conductive path.

The encapsulant can be deposited using a wide variety of techniques including printing and transfer molding. For instance, the encapsulant can be printed on the chip as an epoxy paste and then cured or hardened to form a solid adherent protective layer. The encapsulant can be any of the adhesives mentioned above. Furthermore, the encapsulant need not necessarily contact the chip. For instance, a glob-top coating can be deposited on the chip after mechanically attaching the chip to the routing line, and then the encapsulant can be formed on the glob-top coating. Moreover, the encapsulant need not necessarily contact the metal base, the routing line or the insulative base. For instance, a solder mask can be deposited on the metal base and the routing line, then the chip can be mechanically attached to the routing line, and then the encapsulant can be formed on the chip and the solder mask.

The insulative base may be rigid or flexible, and can be various dielectric films or prepregs formed from numerous organic or inorganic insulators such as tape (polyimide), epoxy, silicone, glass, aramid and ceramic. Organic insulators are preferred for low cost, high dielectric applications, whereas inorganic insulators are preferred when high thermal dissipation and a matched thermal coefficient of expansion are important. For instance, the insulative base can initially be an epoxy paste that includes an epoxy resin, a curing agent, an accelerator and a filler, that is subsequently cured or hardened to form a solid adherent insulative layer. The filler can be an inert material such as silica (powdered fused quartz) that improves thermal conductivity, thermal shock resistance and thermal coefficient of expansion matching. Organic fiber reinforcement may also be used in resins such as epoxy, cyanate ester, polyimide, PTFE and combinations thereof. Fibers that may be used include aramid, polyester, polyamide, poly-ether-ether-ketone, polyimide, polyetherimide and polysulfone. The fiber reinforcement can be woven fabric, woven glass, random microfiber glass, woven quartz, woven, aramid, non-woven fabric, non-woven aramid fiber or paper. Commercially available dielectric materials such as SPEEDBOARD C prepreg by W.L. Gore & Associates of Eau Claire, Wis. are suitable.

The insulative base can be deposited in numerous manners, including printing and transfer molding.

The insulative base can be thinned to expose the pillar using a wide variety of techniques including grinding (including mechanical polishing and chemical-mechanical polishing), blanket laser ablation and blanket plasma etching. Likewise, the insulative base can have a selected portion removed to expose the pillar using a wide variety of techniques including selective laser ablation, selective plasma etching and photolithography.

The connection joint can be formed from a wide variety of materials including copper, gold, nickel, palladium, tin, alloys thereof, and combinations thereof, can be formed by a wide variety of processes including electroplating, electroless plating, ball bonding, wire bonding, stud bumping, solder reflowing, conductive adhesive curing, and welding, and can have a wide variety of shapes and sizes. The shape and composition of the connection joint depends on the composition of the metals it contacts as well as design and reliability considerations. Further details regarding an electroplated connection joint are disclosed in U.S. application Ser. No. 09/865,367 filed May 24, 2001 by Charles W. C. Lin entitled "Semiconductor Chip Assembly with Simultaneously Electroplated Contact Terminal and Connection Joint" which is incorporated by reference. Further details regarding an electrolessly plated connection joint are disclosed in U.S. application Ser. No. 09/864,555 filed May 24, 2001 by Charles W. C. Lin entitled "Semiconductor Chip Assembly with Simultaneously Electrolessly Plated Contact Terminal and Connection Joint" which is incorporated by reference. Further details regarding a ball bond connection joint are disclosed in U.S. application Ser. No. 09/864,773 filed May 24, 2001 by Charles W. C. Lin entitled "Semiconductor Chip Assembly with Ball Bond Connection Joint" which is incorporated by reference. Further details regarding a solder or conductive adhesive connection joint are disclosed in U.S. application Ser. No. 09/927,216 filed Aug. 10, 2001 by Charles W. C. Lin entitled "Semiconductor Chip Assembly with Hardened Connection Joint" which is incorporated by reference. Further details regarding a welded connection joint are disclosed in U.S. application Ser. No. 10/302,642 filed Nov. 23, 2002 by Cheng-Lien Chiang et al. entitled "Method of Connecting a Conductive Trace to a Semiconductor Chip Using Plasma Undercut Etching" which is incorporated by reference.

After the conductive trace is formed, if a plating bus exists then it is disconnected from the conductive trace. The plating bus can be disconnected by mechanical sawing, laser cutting, chemical etching, and combinations thereof. If the plating bus is disposed about the periphery of the assembly but is not integral to the assembly, then the plating bus can be disconnected when the assembly is singulated from other assemblies. However, if the plating bus is integral to the assembly, or singulation has already occurred, then a photolithography step can be added to selectively cut related circuitry on the assembly that is dedicated to the plating bus since this circuitry would otherwise short the conductive traces together. Furthermore, the plating bus can be disconnected by etching the metal base.

A soldering material or solder ball can be deposited on the pillar by plating or printing or placement techniques if required for the next level assembly. However, the next level assembly may not require that the semiconductor chip assembly contain solder. For instance, in land grid array (LGA) packages, the soldering material is normally provided by the panel rather than the contact terminals on the semiconductor chip assembly.

It is understood that, in the context of the present invention, mechanically attaching the chip to the routing line, electrically connecting the routing line to the pad, forming the encapsulant and etching the metal base using a first wet chemical etch and then a second wet chemical etch to form the pillar means that the second wet chemical etch occurs after the first wet chemical etch. However, this does not require, unless otherwise stated, that the second wet chemical etch occurs after mechanically attaching the chip to the routing line, electrically connecting the routing line to the pad or forming the encapsulant. Instead, this allows the second wet chemical etch to occur before or after mechanically attaching the chip to the routing line, electrically connecting the routing line to the pad and forming the encapsulant.

It is also understood that, in the context of the present invention, electrically connecting the routing line to the pad by forming the connection joint means that the connection joint electrically connects the routing line to the pad. This is true regardless of whether the connection joint contacts or is spaced from the routing line as long as the connection joint is electrically connected to the routing line. This is also true regardless of whether the connection joint contacts or is spaced from the pad as long as the connection joint is electrically connected to the pad.

It is also understood that, in the context of the present invention, electrically connecting the routing line to the pad means that the routing line and the pad are no longer electrically isolated from one another. This is true regardless of whether the electrically conductive path between the routing line and the pad includes or requires a passive component such as a capacitor or a resistor.

The "upward" and "downward" vertical directions do not depend on the orientation of the assembly, as will be readily apparent to those skilled in the art. For instance, the pillar tapers inwardly and extends vertically beyond the routing line in the "downward" direction, regardless of whether the assembly is inverted and/or mounted on a printed circuit board. Likewise, the routing line extends "laterally" from the pillar regardless of whether the assembly is inverted, rotated or slated. Thus, the "upward" and "downward" directions are opposite one another and orthogonal to the "lateral" direction. Moreover, the encapsulant and the chip are shown above the insulative base with a single orientation throughout the drawings for ease of comparison between the figures, although the assembly and its components may be inverted at various manufacturing stages.

The semiconductor chip assembly can be a single-chip module (SCM) or a multi-chip module (MCM). For instance, a single assembly can be a first-level multi-chip module. For example, the metal layer and the etch masks for multiple chips can be electroplated on the metal plate, then the routing lines for the chips can be electroplated on the metal layer, then the terminals can be electroplated on the respective routing lines, then separate spaced adhesives for the respective chips can be selectively deposited on the metal base, then the chips can be placed on the corresponding adhesives, then the adhesives can be simultaneously hardened, then the connection joints for the respective chips can be formed, then the encapsulant can be formed on the metal base, the routing lines, the connection joints, the chips and the adhesives, then the metal base can be etched to simultaneously form the pillars, then the insulative base can be formed on the pillars, the routing lines, the adhesives and the encapsulant, then the insulative base can be grinded, then the metal coatings can be simultaneously electrolessly plated on the respective pillars, then the solder balls can be deposited and simultaneously reflowed on the respective metal coatings, and then the encapsulant and the insulative base can be cut, thereby separating the assembly from other assemblies.

The working format for the semiconductor chip assembly can be a single assembly or multiple assemblies based on the manufacturing design. For instance, a single assembly can be manufactured individually. Alternatively, numerous assemblies can be simultaneously batch manufactured using a single metal base, a single encapsulant and a single insulative base and then separated from one another. For example, the metal layer and the etch masks for multiple assemblies can be electroplated on the metal plate, then the routing lines for the respective assemblies can be electroplated on the metal layer, then the terminals can be electroplated on the respective routing lines, then separate spaced adhesives for the respective assemblies can be selectively deposited on the metal base, then the chips can be placed on the corresponding adhesives, then the adhesives can be simultaneously hardened, then the connection joints for the respective assemblies can be formed, then the encapsulant can be formed on the metal base, the routing lines, the connection joints, the chips and the adhesives, then the metal base can be etched to simultaneously form the pillars, then the insulative base can be formed on the pillars, the routing lines, the adhesives and the encapsulant, then the insulative base can be grinded, then the metal coatings can be simultaneously electrolessly plated on the respective pillars, then the solder balls can be deposited and simultaneously reflowed on the respective assemblies, and then the encapsulant and the insulative base can be cut, thereby separating the individual assemblies from one another.

The semiconductor chip assembly can have a wide variety of packaging formats as required by the next level assembly. For instance, the conductive traces can be configured so that the assembly is a grid array such as a ball grid array (BGA), column grid array (CGA), land grid array (LGA) or pin grid array (PGA).

Advantageously, the semiconductor chip assembly of the present invention is reliable and inexpensive. The encapsulant and the insulative base can protect the chip from handling damage, provide a known dielectric barrier for the conductive trace and protect the assembly from contaminants and unwanted solder reflow during the next level assembly. The encapsulant can provide mechanical support for the conductive trace after the pillar is formed. The mode of the connection can shift from the initial mechanical coupling to metallurgical coupling to assure sufficient metallurgical bond strength. Furthermore, the conductive trace can be mechanically and metallurgically coupled to the chip without wire bonding, TAB, solder or conductive adhesive, although the process is flexible enough to accommodate these techniques if desired. The process is highly versatile and permits a wide variety of mature connection joint technologies to be used in a unique and improved manner. The tapered pillar is particularly well-suited for reducing thermal mismatch related stress in the next level assembly and yields enhanced reliability for the next level assembly that exceeds that of conventional BGA packages. Furthermore, the etch mask can be removed at essentially the same time that the second wet chemical etch etches through the metal layer and the pillar is formed. As a result, the assembly of the present invention significantly enhances throughput, yield and performance characteristics compared to conventional packaging techniques. Moreover, the assembly of the present invention is well-suited for use with materials compatible with copper chip requirements.

Various changes and modifications to the presently preferred embodiments described herein will be apparent to those skilled in the art. For instance, the materials, dimensions and shapes described above are merely exemplary. Such changes and modifications may be made without departing from the spirit and scope of the present invention as defined in the appended claims.

I claim:

1. A method of making a semiconductor chip assembly, comprising:
   providing a metal base, a routing line and an etch mask, wherein the metal base includes a metal plate, a metal layer and first and second opposing surfaces, the metal layer provides the first surface of the metal base, the metal plate provides the second surface of the metal base, the routing line contacts the first surface of the metal base and the etch mask contacts the second surface of the metal base; then
   mechanically attaching a semiconductor chip to the routing line, wherein the chip includes a conductive pad;
   electrically connecting the routing line to the pad; and
   etching the metal base using a first wet chemical etch that contacts the metal plate, the metal layer and the etch mask without contacting the routing line and is selective of the metal plate with respect to the metal layer and the etch mask and then a second wet chemical etch that contacts the metal plate, the metal layer, the routing line and the etch mask and is selective of the metal layer and the etch mask, wherein the first and second wet chemical etches form a pillar from an unetched portion of the metal base defined by the etch mask and the pillar contacts the routing line.

2. The method of claim 1, wherein providing the metal base, the routing line and the etch mask includes simultaneously depositing the metal layer and the etch mask on the metal plate and then depositing the routing line on the metal layer.

3. The method of claim 1, wherein providing the metal base, the routing line and the etch mask includes the following steps in the sequence set forth:
providing the metal plate with first and second opposing surfaces;
providing a first plating mask on the second surface of the metal plate, wherein the first plating mask includes an opening that exposes a portion of the second surface of the metal plate;
simultaneously electroplating the metal layer on the first surface of the metal plate and the etch mask on the exposed portion of the second surface of the metal plate through the opening in the first plating mask;
removing the first plating mask;
providing a second plating mask on the first surface of metal base and a third plating mask on the second surface of the metal base and the etch mask, wherein the second plating mask includes an opening that exposes a portion of the first surface of the metal base, and the third plating mask covers the etch mask;
electroplating the routing line on the exposed portion of the first surface of the metal base through the opening in the third plating mask; and
removing the second and third plating masks.

4. The method of claim 1, wherein etching the metal base removes a first portion of the metal base that contacts the routing line without removing a second portion of the metal base that contacts the routing line, thereby reducing but not eliminating contact area between the metal base and the routing line.

5. The method of claim 1, wherein etching the metal base electrically isolates the routing line from other routing lines that contact the metal base.

6. The method of claim 1, wherein etching the metal base electrically isolates the pad from other conductive pads of the chip.

7. The method of claim 1, wherein etching the metal base removes most of the metal base.

8. The method of claim 1, wherein the first wet chemical etch etches through the metal plate, thereby exposing the metal layer without exposing the routing line.

9. The method of claim 1, wherein the second wet chemical etch etches through the metal layer, thereby exposing the routing line.

10. The method of claim 1, wherein the second wet chemical etch is selective of the metal plate and the routing line.

11. The method of claim 1, wherein the second wet chemical etch removes the etch mask.

12. The method of claim 1, including mechanically attaching the chip to the routing line before forming the pillar.

13. The method of claim 1, including mechanically attaching the chip to the routing line after forming the pillar.

14. The method of claim 1, including electrically connecting the routing line to the pad before forming the pillar.

15. The method of claim 1, including electrically connecting the routing line to the pad after forming the pillar.

16. The method of claim 1, including mechanically attaching the chip to the routing line and electrically connecting the routing line to the pad before forming the pillar.

17. The method of claim 1, including mechanically attaching the chip to the routing line and electrically connecting the routing line to the pad after forming the pillar.

18. The method of claim 1, including forming an encapsulant that contacts and covers the chip after mechanically attaching the chip to the routing line.

19. The method of claim 1, including depositing an insulative base over the pillar and the routing line after mechanically attaching the chip to the routing line, then hardening the insulative base, and then removing a portion of the insulative base thereby exposing the pillar without exposing the routing line.

20. The method of claim 1, wherein the assembly is a first-level package.

21. A method of making a semiconductor chip assembly, comprising:
providing a metal plate with first and second opposing surfaces; then
depositing a metal layer on the first surface of the metal plate and an etch mask on the second surface of the metal plate; then
depositing a routing line on the metal layer, wherein a metal base includes the metal plate, the metal layer and first and second opposing surfaces, the metal layer provides the first surface of the metal base, the metal plate provides the second surface of the metal base, the routing line contacts the first surface of the metal base and the etch mask contacts the second surface of the metal base; then
mechanically attaching a semiconductor chip to the routing line, wherein the chip includes a conductive pad;
electrically connecting the routing line to the pad; and
etching the metal base using a first wet chemical etch that contacts the metal plate, the metal layer and the etch mask without contacting the routing line and is selective of the metal plate with respect to the metal layer and the etch mask and then a second wet chemical etch that contacts the metal plate, the metal layer, the routing line and the etch mask and is selective of the metal layer and the etch mask, wherein the first and second wet chemical etches form a pillar from an unetched portion of the metal base defined by the etch mask and the pillar contacts the routing line.

22. The method of claim 21, wherein depositing the metal layer and the etch mask on the metal plate includes simultaneously depositing the metal layer and the etch mask on the metal plate.

23. The method of claim 21, wherein depositing the metal layer and the etch mask on the metal plate and then depositing the routing line on the metal layer includes the following steps in the sequence set forth:
providing the metal plate;
providing a first plating mask on the second surface of the metal plate, wherein the first plating mask includes an opening that exposes a portion of the second surface of the metal plate;
simultaneously electroplating the metal layer on the first surface of the metal plate and the etch mask on the exposed portion of the second surface of the metal plate through the opening in the first plating mask;
removing the first plating mask;
providing a second plating mask on the first surface of metal base and a third plating mask on the second surface of the metal base and the etch mask, wherein the second plating mask includes an opening that exposes a portion of the first surface of the metal base, and the third plating mask covers the etch mask;

electroplating the routing line on the exposed portion of the first surface of the metal base through the opening in the third plating mask; and removing the second and third plating masks.

24. The method of claim 21, wherein etching the metal base removes a first portion of the metal base that contacts the routing line without removing a second portion of the metal base that contacts the routing line, thereby reducing but not eliminating contact area between the metal base and the routing line.

25. The method of claim 21, wherein etching the metal base electrically isolates the routing line from other routing lines that contact the metal base.

26. The method of claim 21, wherein etching the metal base electrically isolates the pad from other conductive pads of the chip.

27. The method of claim 21, wherein etching the metal base removes most of the metal base.

28. The method of claim 21, wherein the first wet chemical etch etches through the metal plate, thereby exposing the metal layer without exposing the routing line.

29. The method of claim 21, wherein the second wet chemical etch etches through the metal layer, thereby exposing the routing line.

30. The method of claim 21, wherein the second wet chemical etch is selective of the metal plate and the routing line.

31. The method of claim 21, wherein the second wet chemical etch removes the etch mask.

32. The method of claim 21, including mechanically attaching the chip to the routing line before forming the pillar.

33. The method of claim 21, including mechanically attaching the chip to the routing line after forming the pillar.

34. The method of claim 21, including electrically connecting the routing line to the pad before forming the pillar.

35. The method of claim 21, including electrically connecting the routing line to the pad after forming the pillar.

36. The method of claim 21, including mechanically attaching the chip to the routing line and electrically connecting the routing line to the pad before forming the pillar.

37. The method of claim 21, including mechanically attaching the chip to the routing line and electrically connecting the routing line to the pad after forming the pillar.

38. The method of claim 21, including forming an encapsulant that contacts and covers the chip after mechanically attaching the chip to the routing line.

39. The method of claim 21, including depositing an insulative base over the pillar and the routing line after mechanically attaching the chip to the routing line, then hardening the insulative base, and then removing a portion of the insulative base thereby exposing the pillar without exposing the routing line.

40. The method of claim 21, wherein the assembly is a first-level package.

41. A method of making a semiconductor chip assembly, comprising:

providing a metal plate with first and second opposing surfaces; then depositing a metal layer on the first surface of the metal plate and an etch mask on the second surface of the metal plate; then depositing a routing line on the metal layer, wherein a metal base includes the metal plate, the metal layer and first and second opposing surfaces, the metal layer provides the first surface of the metal base, the metal plate provides the second surface of the metal base, the routing line contacts the first surface of the metal base and the etch mask contacts the second surface of the metal base; then mechanically attaching a semiconductor chip to the routing line, wherein the chip includes a conductive pad;

electrically connecting the routing line to the pad; and etching the metal base using a first wet chemical etch and then a second wet chemical etch, wherein the first wet chemical etch contacts the metal plate, the metal layer and the etch mask without contacting the routing line and is selective of the metal plate with respect to the metal layer and the etch mask and etches through the metal plate, thereby exposing the metal layer without exposing the routing line, the second wet chemical etch contacts the metal plate, the metal layer, the routing line and the etch mask and is selective of the metal layer and the etch mask and etches through the metal layer, thereby exposing the routing line and removing the etch mask, the first and second wet chemical etches form a pillar from an unetched portion of the metal base defined by the etch mask and the a pillar contacts the routing line.

42. The method of claim 41, wherein depositing the metal layer and the etch mask on the metal plate includes simultaneously depositing the metal layer and the etch mask on the metal plate.

43. The method of claim 41, wherein depositing the metal layer and the etch mask on the metal plate and then depositing the routing line on the metal layer includes the following steps in the sequence set forth:

providing the metal plate;

providing a first plating mask on the second surface of the metal plate, wherein the first plating mask includes an opening that exposes a portion of the second surface of the metal plate;

simultaneously electroplating the metal layer on the first surface of the metal plate and the etch mask on the exposed portion of the second surface of the metal plate through the opening in the first plating mask;

removing the first plating mask;

providing a second plating mask on the first surface of metal base and a third plating mask on the second surface of the metal base and the etch mask, wherein the second plating mask includes an opening that exposes a portion of the first surface of the metal base, and the third plating mask covers the etch mask;

electroplating the routing line on the exposed portion of the first surface of the metal base through the opening in the third plating mask; and removing the second and third plating masks.

44. The method of claim 41, wherein etching the metal base removes a first portion of the metal base that contacts the routing line without removing a second portion of the metal base that contacts the routing line, thereby reducing but not eliminating contact area between the metal base and the routing line.

45. The method of claim 41, wherein etching the metal base electrically isolates the routing line from other routing lines that contact the metal base.

46. The method of claim 41, wherein etching the metal base electrically isolates the pad from other conductive pads of the chip.

47. The method of claim 41, wherein etching the metal base removes most of the metal base.

48. The method of claim 41, wherein the second wet chemical etch is selective of the metal plate and the routing line.

49. The method of claim 41, wherein the second wet chemical etch etches through the metal layer and removes the etch mask at essentially the same time.

50. The method of claim 41, wherein the metal plate is copper, and the metal layer and the etch mask are nickel.

51. The method of claim 41, wherein the metal plate and the routing line are copper, and the metal layer and the etch mask are nickel.

52. The method of claim 41, including mechanically attaching the chip to the routing line before forming the pillar.

53. The method of claim 41, including mechanically attaching the chip to the routing line after forming the pillar.

54. The method of claim 41, including electrically connecting the routing line to the pad before forming the pillar.

55. The method of claim 41, including electrically connecting the routing line to the pad after forming the pillar.

56. The method of claim 41, including mechanically attaching the chip to the routing line and electrically connecting the routing line to the pad before forming the pillar.

57. The method of claim 41, including mechanically attaching the chip to the routing line and electrically connecting the routing line to the pad after forming the pillar.

58. The method of claim 41, including forming an encapsulant that contacts and covers the chip after mechanically attaching the chip to the routing line.

59. The method of claim 41, including depositing an insulative base over the pillar and the routing line after mechanically attaching the chip to the routing line, then hardening the insulative base, and then removing a portion of the insulative base thereby exposing the pillar without exposing the routing line.

60. The method of claim 41, wherein the assembly is a first-level package.

61. A method of making a semiconductor chip assembly, comprising:
providing a metal plate with first and second opposing surfaces; then
depositing a metal layer on the first surface of the metal plate and an etch mask on the second surface of the metal plate; then
depositing a routing line on the metal layer, wherein a metal base includes the metal plate, the metal layer and first and second opposing surfaces, the metal layer provides the first surface of the metal base, the metal plate provides the second surface of the metal base, the routing line contacts the first surface of the metal base and the etch mask contacts the second surface of the metal base; then
mechanically attaching a semiconductor chip to the routing line, wherein the chip includes a conductive pad;
electrically connecting the routing line to the pad;
forming an encapsulant that contacts and covers the chip and covers the routing line; and
etching the metal base using a first wet chemical etch and then a second wet chemical etch, wherein the first wet chemical etch contacts the metal plate, the metal layer and the etch mask without contacting the routing line and is selective of the metal plate with respect to the metal layer and the etch mask and etches through the metal plate, thereby exposing the metal layer without exposing the routing line, the second wet chemical etch contacts the metal plate, the metal layer, the routing line and the etch mask and is selective of the metal layer and the etch mask and etches through the metal layer, thereby exposing the routing line and removing the etch mask, the first and second wet chemical etches form a pillar from an unetched portion of the metal base defined by the etch mask and the pillar contacts the routing line.

62. The method of claim 61, wherein depositing the metal layer and the etch mask on the metal plate and then depositing the routing line on the metal layer includes the following steps in the sequence set forth:
providing the metal plate;
providing a first plating mask on the second surface of the metal plate, wherein the first plating mask includes an opening that exposes a portion of the second surface of the metal plate;
simultaneously electroplating the metal layer on the first surface of the metal plate and the etch mask on the exposed portion of the second surface of the metal plate through the opening in the first plating mask;
removing the first plating mask;
providing a second plating mask on the first surface of metal base and a third plating mask on the second surface of the metal base and the etch mask, wherein the second plating mask includes an opening that exposes a portion of the first surface of the metal base, and the third plating mask covers the etch mask;
electroplating the routing line on the exposed portion of the first surface of the metal base through the opening in the third plating mask; and
removing the second and third plating masks.

63. The method of claim 61, wherein etching the metal base removes a first portion of the metal base that contacts the routing line without removing a second portion of the metal base that contacts the routing line, thereby reducing but not eliminating contact area between the metal base and the routing line.

64. The method of claim 61, wherein etching the metal base removes most of the metal base and electrically isolates the routing line from other routing lines that contact the metal base.

65. The method of claim 61, wherein the second wet chemical etch is selective of the metal plate and the routing line.

66. The method of claim 61, wherein the metal plate and the routing line are copper, and the metal layer and the etch mask are nickel.

67. The method of claim 61, including mechanically attaching the chip to the routing line, electrically connecting the routing line to the pad and forming the encapsulant before forming the pillar.

68. The method of claim 61, including mechanically attaching the chip to the routing line, electrically connecting the routing line to the pad and forming the encapsulant after forming the pillar.

69. The method of claim 61, including depositing an insulative base over the pillar and the routing line after mechanically attaching the chip to the routing line and forming the encapsulant, then hardening the insulative base, and then removing a portion of the insulative base thereby exposing the pillar without exposing the routing line.

70. The method of claim 61, wherein the assembly is a first-level package.

71. A method of making a semiconductor chip assembly, comprising:
providing a metal plate with first and second opposing surfaces; then depositing a metal layer on the first surface of the metal plate and first and second etch masks on the second surface of the metal plate; then depositing a routing line on the metal layer, wherein a metal base includes the metal plate, the metal layer and first and second opposing surfaces, the metal layer provides the first surface of the metal base, the metal plate provides the second surface of the metal base, the routing line contacts the first surface of the metal base and the first and second etch masks contact the second surface of the metal base; then mechanically attaching a semiconductor chip to the routing line, wherein the chip includes a conductive pad;

electrically connecting the routing line to the pad; and etching the metal base using a first wet chemical etch and then a second wet chemical etch, wherein the first wet chemical etch contacts the metal plate, the metal layer and the first and second etch masks without contacting the routing line and is selective of the metal plate with respect to the metal layer and the first and second etch masks and etches through the metal plate, thereby exposing the metal layer without exposing the routing line, the second wet chemical etch contacts the metal plate, the metal layer, the routing line and the first and second etch masks and is selective of the metal layer and the first and second etch masks and etches through the metal layer, thereby exposing the routing line and removing the first and second etch masks, the first and second wet chemical etches form a first pillar from a first unetched portion of the metal base defined by the first etch mask and a second pillar from a second unetched portion of the metal base defined by the second etch mask and the first and second pillars contact the routing line.

72. The method of claim 71, wherein depositing the metal layer and the first and second etch masks on the metal plate and then depositing the routing line on the metal layer includes the following steps in the sequence set forth:

providing the metal plate;

providing a first plating mask on the second surface of the metal plate, wherein the first plating mask includes first and second openings that expose first and second portions of the second surface of the metal plate;

simultaneously electroplating the metal layer on the first surface of the metal plate and the first and second etch masks on the exposed first and second portions of the second surface of the metal plate through the first and second openings in the first plating mask;

removing the first plating mask;

providing a second plating mask on the first surface of metal base and a third plating mask on the second surface of the metal base and the first and second etch masks, wherein the second plating mask includes an opening that exposes a portion of the first surface of the metal base, and the third plating mask covers the first and second etch masks;

electroplating the routing line on the exposed portion of the first surface of the metal base through the opening in the third plating mask; and removing the second and third plating masks.

73. The method of claim 71, wherein etching the metal base removes a first portion of the metal base that contacts the routing line without removing second and third portions of the metal base that contact the routing line, thereby reducing but not eliminating contact area between the metal base and the routing line.

74. The method of claim 71, wherein etching the metal base removes most of the metal base and electrically isolates the routing line from other routing lines that contact the metal base.

75. The method of claim 71, wherein the second wet chemical etch is selective of the metal plate and the routing line.

76. The method of claim 71, wherein the metal plate and the routing line are copper, and the metal layer and the first and second etch masks are nickel.

77. The method of claim 71, including mechanically attaching the chip to the routing line and electrically connecting the routing line to the pad before forming the first and second pillars.

78. The method of claim 71, including mechanically attaching the chip to the routing line and electrically connecting the routing line to the pad after forming the first and second pillars.

79. The method of claim 71, including:

forming an encapsulant that contacts and covers the chip and covers the routing line; and then depositing an insulative base over the first and second pillars and the routing line, then hardening the insulative base, and then removing a portion of the insulative base thereby exposing the first and second pillars without exposing the routing line.

80. The method of claim 71, wherein the assembly is a first-level package.

81. A method of making a semiconductor chip assembly, comprising:

providing a metal plate with first and second opposing surfaces; then depositing a metal layer on the first surface of the metal plate and first and second etch masks on the second surface of the metal plate; then depositing first and second routing lines on the metal layer, wherein a metal base includes the metal plate, the metal layer and first and second opposing surfaces, the metal layer provides the first surface of the metal base, the metal plate provides the second surface of the metal base, the first and second routing lines contact the first surface of the metal base and the first and second etch masks contact the second surface of the metal base; then mechanically attaching a semiconductor chip to the first and second routing lines, wherein the chip includes first and second conductive pads;

electrically connecting the first routing line to the first pad;

electrically connecting the second routing line to the second pad; and etching the metal base using a first wet chemical etch and then a second wet chemical etch, wherein the first wet chemical etch contacts the metal plate, the metal layer and the first and second etch masks without contacting the first and second routing lines and is selective of the metal plate with respect to the metal layer and the first and second etch masks and etches through the metal plate, thereby exposing the metal layer without exposing the first and second routing lines, the second wet chemical etch contacts the metal plate, the metal layer, the first and second routing lines and the first and second etch masks and is selective of the metal layer and the first and second etch masks and etches through the metal layer, thereby exposing the first and second routing lines and removing the first and second etch masks, the first and second wet chemical etches form a first pillar from a first unetched portion of the metal base defined by the first etch mask and a second pillar from a second unetched portion of the metal base defined by the second etch mask, the first pillar contacts the first routing line and is spaced from the second routing line and the second pillar contacts the second routing line and is spaced from the first routing line.

82. The method of claim 81, wherein depositing the metal layer and the first and second etch masks on the metal plate and then depositing the first and second routing lines on the metal layer includes the following steps in the sequence set forth:
providing the metal plate;
providing a first plating mask on the second surface of the metal plate, wherein the first plating mask includes first and second openings that expose first and second portions of the second surface of the metal plate;
simultaneously electroplating the metal layer on the first surface of the metal plate and the first and second etch masks on the exposed first and second portions of the second surface of the metal plate through the first and second openings in the first plating mask;
removing the first plating mask;
providing a second plating mask on the first surface of metal base and a third plating mask on the second surface of the metal base and the first and second etch masks, wherein the second plating mask includes first and second openings that expose first and second portions of the first surface of the metal base, and the third plating mask covers the first and second etch masks;
simultaneously electroplating the first and second routing lines on the exposed first and second portions of the first surface of the metal base through the first and second openings in the third plating mask; and
removing the second and third plating masks.

83. The method of claim 81, wherein etching the metal base removes portions of the metal base that contact the first and second routing lines without removing other portions of the metal base that contact the first and second routing lines, thereby reducing but not eliminating contact area between the metal base and the first and second routing lines.

84. The method of claim 81, wherein etching the metal base removes most of the metal base and electrically isolates the first and second routing lines from one another.

85. The method of claim 81, wherein the second wet chemical etch is selective of the metal plate and the first and second routing lines.

86. The method of claim 81, wherein the metal plate and the first and second routing lines are copper, and the metal layer and the first and second etch masks are nickel.

87. The method of claim 81, including mechanically attaching the chip to the first and second routing lines, electrically connecting the first routing line to the first pad and electrically connecting the second routing line to the second pad before forming the first and second pillars.

88. The method of claim 81, including mechanically attaching the chip to the first and second routing lines, electrically connecting the first routing line to the first pad and electrically connecting the second routing line to the second pad after forming the first and second pillars.

89. The method of claim 81, including:
forming an encapsulant that contacts and covers the chip and covers the first and second routing lines; and
depositing an insulative base over the first and second pillars and the first and second routing lines, then hardening the insulative base, and then removing a portion of the insulative base thereby exposing the first and second pillars without exposing the first and second routing lines.

90. The method of claim 81, wherein the assembly is a first-level package.

91. A method of making a semiconductor chip assembly, comprising:
providing a metal plate with first and second opposing surfaces; then
depositing a metal layer on the first surface of the metal plate and first and second etch masks on the second surface of the metal plate; then
depositing first and second routing lines on the metal layer, wherein a metal base includes the metal plate, the metal layer and first and second opposing surfaces, the metal layer provides the first surface of the metal base, the metal plate provides the second surface of the metal base, the first and second routing lines contact the first surface of the metal base and the first and second etch masks contact the second surface of the metal base; then
mechanically attaching a first semiconductor chip to the first routing line, wherein the first chip includes a first conductive pad;
mechanically attaching a second semiconductor chip to the second routing line, wherein the second chip includes a second conductive pad;
electrically connecting the first routing line to the first pad;
electrically connecting the second routing line to the second pad; and
etching the metal base using a first wet chemical etch and then a second wet chemical etch, wherein the first wet chemical etch contacts the metal plate, the metal layer and the first and second etch masks without contacting the first and second routing lines and is selective of the metal plate with respect to the metal layer and the first and second etch masks and etches through the metal plate, thereby exposing the metal layer without exposing the first and second routing lines, the second wet chemical etch contacts the metal plate, the metal layer, the first and second routing lines and the first and second etch masks and is selective of the metal layer and the first and second etch masks and etches through the metal layer, thereby exposing the first and second routing lines and removing the first and second etch masks, the first and second wet chemical etches form a first pillar from a first unetched portion of the metal base defined by the first etch and a second pillar from a second unetched portion of the metal base defined by the second etch mask, the first pillar contacts the first routing line and is spaced from the second routing line and the second pillar contacts the second routing line and is spaced from the first routing line.

92. The method of claim 91, wherein depositing the metal layer and the first and second etch masks on the metal plate and then depositing the first and second routing lines on the metal layer includes the following steps in the sequence set forth:
providing the metal plate;
providing a first plating mask on the second surface of the metal plate, wherein the first plating mask includes first and second openings that expose first and second portions of the second surface of the metal plate;
simultaneously electroplating the metal layer on the first surface of the metal plate and the first and second etch masks on the exposed first and second portions of the second surface of the metal plate through the first and second openings in the first plating mask;

removing the first plating mask;

providing a second plating mask on the first surface of metal base and a third plating mask on the second surface of the metal base and the first and second etch masks, wherein the second plating mask includes first and second openings that expose first and second portions of the first surface of the metal base, and the third plating mask covers the first and second etch masks;

simultaneously electroplating the first and second routing lines on the exposed first and second portions of the first surface of the metal base through the first and second openings in the third plating mask; and removing the second and third plating masks.

93. The method of claim 91, wherein etching the metal base removes portions of the metal base that contact the first and second routing lines without removing other portions of the metal base that contact the first and second routing lines, thereby reducing but not eliminating contact area between the metal base and the first and second routing lines.

94. The method of claim 91, wherein etching the metal base removes most of the metal base and electrically isolates the first and second routing lines from one another.

95. The method of claim 91, wherein the second wet chemical etch is selective of the metal plate and the first and second routing lines.

96. The method of claim 91, wherein the metal plate and the first and second routing lines are copper, and the metal layer and the first and second etch masks are nickel.

97. The method of claim 91, including mechanically attaching the first chip to the first routing line, mechanically attaching the second chip to the second routing line, electrically connecting the first routing line to the first pad and electrically connecting the second routing line to the second pad before forming the first and second pillars.

98. The method of claim 91, including mechanically attaching the first chip to the first routing line, mechanically attaching the second chip to the second routing line, electrically connecting the first routing line to the first pad and electrically connecting the second routing line to the second pad after forming the first and second pillars.

99. The method of claim 91, including:

forming an encapsulant that contacts and covers the first and second chips and covers the first and second routing lines; and then depositing an insulative base over the first and second pillars and the first and second routing lines, then hardening the insulative base, and then removing a portion of the insulative base thereby exposing the first and second pillars without exposing the first and second routing lines.

100. The method of claim 91, wherein the assembly is a first-level package.

\* \* \* \* \*